US009805943B2

(12) United States Patent
Kikuchi et al.

(10) Patent No.: US 9,805,943 B2
(45) Date of Patent: Oct. 31, 2017

(54) POLYMER FOR RESIST UNDER LAYER FILM COMPOSITION, RESIST UNDER LAYER FILM COMPOSITION, AND PATTERNING PROCESS

(71) Applicant: SHIN-ETSU CHEMICAL CO., LTD., Tokyo (JP)

(72) Inventors: Rie Kikuchi, Jyoetsu (JP); Takeru Watanabe, Jyoetsu (JP); Seiichiro Tachibana, Jyoetsu (JP); Tsutomu Ogihara, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/060,934

(22) Filed: Mar. 4, 2016

(65) Prior Publication Data

US 2016/0284559 A1    Sep. 29, 2016

(30) Foreign Application Priority Data

Mar. 27, 2015  (JP) .................. 2015-065760

(51) Int. Cl.
*G03F 7/11*   (2006.01)
*H01L 21/308* (2006.01)
(Continued)

(52) U.S. Cl.
CPC ........ *H01L 21/3086* (2013.01); *C08F 220/28* (2013.01); *C08F 220/32* (2013.01);
(Continued)

(58) Field of Classification Search
CPC ........... H01L 21/3086; H01L 21/30604; H01L 21/0274; H01L 21/31144; H01L 21/0332;
(Continued)

(56) References Cited

U.S. PATENT DOCUMENTS 4,835,089 A   5/1989  Iwayanagi et al.
5,919,599 A   7/1999  Meador et al.
(Continued)

FOREIGN PATENT DOCUMENTS

JP   S61-180241 A      8/1986
JP   06-148771 A   *  5/1994
(Continued)

OTHER PUBLICATIONS

Dhal et al ,"Glycidyl Methacrylate-tert-Butyl Acrylate Copolymers: Synthesis, Characterization, and Thermal Studies" Journal of Polymer Science: Polymer Chemistry Edition, vol. 22, 1817-1829 (1984) 0 1984 John Wiley & Sons, Inc.*

(Continued)

*Primary Examiner* — Cynthia Hamilton
(74) *Attorney, Agent, or Firm* — Oliff PLC

(57) ABSTRACT

The invention provides a polymer for a resist under layer film composition, containing a repeating unit shown by the formula (1) and a repeating unit shown by the formula (3),

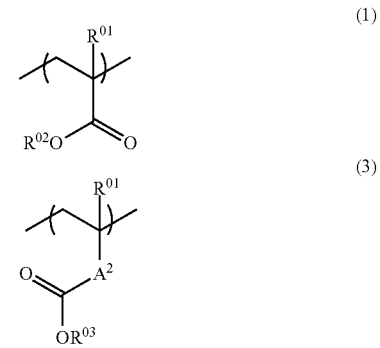

wherein $R^{01}$ independently represents a hydrogen atom or a methyl group; $R^{02}$ represents a group selected from the formulae (1-1) to (1-3); $R^{03}$ represents a saturated or unsaturated tertiary alkyl group having 4 to 20 carbon atoms and optionally containing an oxygen functional group; and $A^2$ represents a single bond or a divalent linking group having 2 to 10 carbon atoms and containing an ester group,

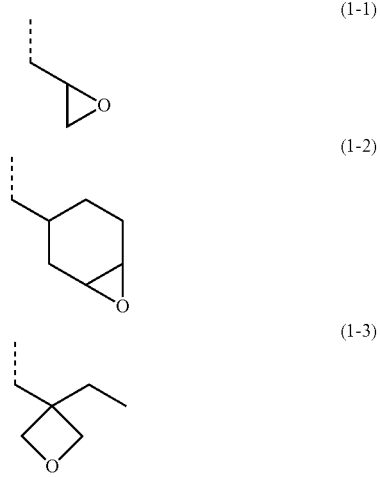

wherein the dotted line represents a bonding arm. There can be provided a polymer for a resist under layer film composition that is capable of forming a resist under layer film having good alkali aqueous hydrogen peroxide resistance, excellent filling and planarizing properties, and excellent dry etching property

32 Claims, 2 Drawing Sheets

(51) Int. Cl.
  *C08F 220/28* (2006.01)
  *C09D 133/14* (2006.01)
  *H01L 21/311* (2006.01)
  *H01L 21/033* (2006.01)
  *H01L 21/027* (2006.01)
  *H01L 21/306* (2006.01)
  *C08F 220/32* (2006.01)
  *G03F 7/09* (2006.01)

(52) U.S. Cl.
  CPC ........... *C09D 133/14* (2013.01); *G03F 7/094* (2013.01); *H01L 21/0274* (2013.01); *H01L 21/0276* (2013.01); *H01L 21/0332* (2013.01); *H01L 21/3081* (2013.01); *H01L 21/30604* (2013.01); *H01L 21/31116* (2013.01); *H01L 21/31133* (2013.01); *H01L 21/31138* (2013.01); *H01L 21/31144* (2013.01); *C08F 2220/281* (2013.01); *C08F 2220/325* (2013.01)

(58) Field of Classification Search
  CPC ........... H01L 21/0276; H01L 21/31116; H01L 21/31138; H01L 21/3081; H01L 21/31133; C08F 220/28; C08F 220/32; C08F 2220/325; C08F 2220/281
  See application file for complete search history.

(56) References Cited

U.S. PATENT DOCUMENTS

| | | |
|---|---|---|
| 2002/0106909 A1 | 8/2002 | Kato et al. |
| 2005/0255712 A1 | 11/2005 | Kato et al. |
| 2009/0274978 A1 | 11/2009 | Ohashi et al. |
| 2010/0022090 A1* | 1/2010 | Sakaguchi ........... C09D 125/02 438/703 |
| 2011/0003250 A1* | 1/2011 | Amara ................. C08F 220/36 430/271.1 |
| 2011/0104612 A1* | 5/2011 | Anno ................... C08F 220/18 430/270.1 |
| 2011/0177302 A1* | 7/2011 | Takita ................... C08F 20/28 428/195.1 |
| 2013/0101936 A1* | 4/2013 | Taniguchi ............. G03F 7/0045 430/280.1 |
| 2013/0210231 A1* | 8/2013 | Senzaki ................ G03F 7/00 438/694 |
| 2013/0302990 A1 | 11/2013 | Watanabe et al. |
| 2014/0255843 A1* | 9/2014 | Kobayashi ............. G03F 7/40 430/270.1 |
| 2016/0218013 A1* | 7/2016 | Ohashi .................. G03F 7/094 |

FOREIGN PATENT DOCUMENTS

| | | |
|---|---|---|
| JP | 3082473 B2 | 8/2000 |
| JP | 2002-334869 A | 11/2002 |
| JP | 2004-205685 A | 7/2004 |
| JP | 2007-199653 A | 8/2007 |
| JP | 4310721 B2 | 8/2009 |
| JP | 2009-269953 A | 11/2009 |
| JP | 2011-74121 A * | 4/2011 |
| JP | 2013-253227 A | 12/2013 |
| JP | 2015-114336 A * | 6/2015 |
| WO | 2004/066377 A1 | 8/2004 |
| WO | 2015/030060 A1 | 3/2015 |

OTHER PUBLICATIONS

English translation of JP, 2015-114336, A (2015) from machine translation from AIPN Japan Patent Office National Center for Industrial Property Information and Training, generated Dec. 28, 2016, 83 pages.*

English translation of JP, 2011-74121, A (2011) from machine translation from AIPN Japan Patent Office National Center for Industrial Property Information and Training, generated Dec. 28, 2016, 20 pages.*

English translation of JP, 06-148771, A (1994) from machine translation from AIPN Japan Patent Office National Center for Industrial Property Information and Training, generated Dec. 28, 2016, 19 pages.*

\* cited by examiner (G)

7

(H)

7

(I)

8
7

(J)

9

(K)
delta 10

10
9

POLYMER FOR RESIST UNDER LAYER FILM COMPOSITION, RESIST UNDER LAYER FILM COMPOSITION, AND PATTERNING PROCESS

BACKGROUND OF THE INVENTION

Field of the Invention

The present invention relates to a polymer for a resist under layer film composition to be used in a fine patterning by the multilayer resist method in the manufacture process of a semiconductor apparatus, a resist under layer film composition containing the polymer, and a patterning process using the composition.

Description of the Related Art

As LSI advances toward high integration and high processing speed, miniaturization of pattern size is progressing rapidly. Along with the miniaturization, the lithography technology has achieved a fine patterning by shortening wavelength of the light source and selecting an appropriate resist composition accordingly. As for such a composition, positive photoresist compositions used for a monolayer are mainly selected. The monolayer positive photoresist composition allows a resist resin to have a skeleton having an etching resistance against dry etching with chlorine- or fluorine-based gas plasma, and provides a switching mechanism that makes an exposed part soluble, thereby dissolving the exposed part to form a pattern and subjecting a substrate to be processed to dry etching using the remaining resist pattern as an etching mask.

However, when a pattern becomes finer, that is, a pattern width is reduced, without changing the thickness of a photoresist film to be used, resolution performance of the photoresist film is lowered. In addition, pattern development of the photoresist film with a developer causes a pattern collapse because a so-called aspect ratio of the pattern is excessively increased. Therefore, a photoresist film has been thinned along with the miniaturization of a pattern.

On the other hand, for processing a substrate to be processed, a method of processing the substrate by dry etching using a pattern-formed photoresist film as an etching mask is generally used. In practice, however, there is no dry etching method capable of providing an absolute etching selectivity between the photoresist film and the substrate to be processed. Therefore, the resist film is also damaged and collapses during processing the substrate, so that the resist pattern cannot be transferred to the substrate to be processed precisely. Accordingly, along with the miniaturization of a pattern, higher dry etching resistance has been required in a resist composition. On the other hand, however, to enhance the resolution, a resin to be used for the photoresist composition has been required to have low absorption at the exposure wavelength. Accordingly, as the exposure light shifts from i-beam to KrF and to ArF to have a shorter wavelength, the resin also shifts to a novolac resin, polyhydroxystyrene, and a resin having an aliphatic polycyclic skeleton. Actually, an etching rate during processing the substrate becomes higher under the dry etching condition, and recent photoresist compositions having a high resolution tend to have a low etching resistance.

Thus, a substrate to be processed has to be dry etched with a thinner photoresist film having lower etching resistance. The need to provide a composition used in this process and the process itself has become urgent.

A multilayer resist method is one of the solutions for these problems. This method is as follows: a middle layer film having a different etching selectivity from a photoresist film (i.e., a resist upper layer film) is placed between the resist upper layer film and a substrate to be processed; a pattern is formed in the resist upper layer film; the pattern is transferred to the middle layer film by dry etching using the upper layer resist film pattern as a dry etching mask; the pattern is further transferred to the substrate to be processed by dry etching using the middle layer film as a dry etching mask.

One of the multilayer resist methods is a three-layer resist method, which can be performed with a typical resist composition used in a monolayer resist method. For example, this three-layer resist method includes the following steps: an organic film containing a novolac resin or the like is formed, as a resist under layer film, on a substrate to be processed; a silicon-containing film is formed thereon as a resist middle layer film; a usual organic photoresist film is formed thereon as a resist upper layer film. Since the organic resist upper layer film exhibits an excellent etching selectivity ratio relative to the silicon-containing resist middle layer film when dry etching is performed with fluorine-based gas plasma, the resist upper layer film pattern can be transferred to the silicon-containing resist middle layer film by dry etching with fluorine-based gas plasma. According to this method, even when a resist composition which is difficult to form a pattern having a sufficient film thickness for directly processing the substrate to be processed or a resist composition which has insufficient dry etching resistance for processing the substrate is used, the pattern can be transferred to the silicon-containing film (resist middle layer film). Further, dry etching using an oxygen gas plasma or a hydrogen gas plasma enables the pattern to be transferred to the organic film (resist under layer film) containing a novolac resin or the like, which has a sufficient dry etching resistance for processing the substrate. As to the resist under layer film, many materials are already known as disclosed in Patent Document 1.

In recent years, many studies are made on a semiconductor apparatus having a novel structure such as a multi-gate structure. Accordingly, there is a growing need for a resist under layer film having more excellent filling and planarizing properties than conventional one. For example, when a substrate to be processed used as a base has a fine pattern structure such as hole, trench, and fin, gap-filling property is required to fill the gap of the pattern with a resist under layer film without space. In addition, when the substrate to be processed used as a base has a step or when both of a pattern-dense portion and a no-pattern region exist in one wafer, the film surface is necessary to be planarized by the resist under layer film. By planarizing the surface of the under layer film, fluctuation in film thickness of a resist middle layer film and a resist upper layer film formed thereon is controlled, whereby the reduction of a focus margin in lithography or a margin in the processing step of the substrate to be processed thereafter can be inhibited. In addition, to completely remove the resist under layer film used in filling and planarizing by dry etching after processing the substrate, a resist under layer film having a dry etching property different from the above films, for example, a resist under layer film having dry etching rate higher than that of the resist upper layer film is required in some cases. Furthermore, it may be also necessary to process the substrate by wet etching with a chemical reagent. In this case, the resist under layer film used as a processing mask also requires a resistance to a wet etching liquid.

Detailed explanation is now given about the background that materials for the wet etching process is required in the multilayer resist method. In the cutting-edge semiconductor apparatus, technologies such as three-dimensional transistor and through interconnection have been used to improve performances of the semiconductor apparatus. In a patterning process for forming such a structure in the semiconductor apparatus, patterning by the multilayer resist method has also been applied. Such a patterning sometimes requires, after pattern formation, the step of removing the silicon-containing resist middle layer film without causing damage to the pattern. If the removal is inadequate, more specifically, if the wafer is subjected to a subsequent manufacturing process while an object to be cleaned still remains thereon, yield of device production is surely lowered. Accordingly, as a device progresses toward miniaturization, a higher cleaning degree is required in the cleaning step. However, main constitutional elements of the conventional silicon-containing resist middle layer film and that of the semiconductor apparatus substrate are both silicon in many cases. Therefore, if one wishes to selectively remove the silicon-containing resist middle layer film by dry etching, it is difficult to suppress damage to the semiconductor apparatus substrate because both the constitutional components are similar. This problem cannot be resolved by wet etching using a usual hydrofluoric acid type peeling solution. Thus, as a peeling liquid that does not cause damage to a semiconductor apparatus substrate, a wet etching liquid composed of an alkali aqueous hydrogen peroxide called Standard Clean-1 (SC1), which has been generally used in the semiconductor manufacturing process, is considered to be used. In this case, resistance to an alkali aqueous hydrogen peroxide is rather required in the resist under layer film.

As to the resist under layer film composition, for use in manufacturing a semiconductor apparatus, having a high dry etching rate and capable of planarizing a stepped substrate, for example, Patent Document 2 discloses a material containing a polymer such as polyglycidyl methacrylate. Moreover, as to the resist under layer film composition, for use in manufacturing a semiconductor apparatus, having a high dry etching rate, Patent Document 3 discloses a material containing a copolymer produced from monomers such as (meth)acrylic acid and glycidyl (meth)acrylate; and Patent Document 4 discloses a material containing a cross linking agent and a copolymer produced from monomers such as hydroxypropyl methacrylate. However, these known materials do not have sufficient filling and planarizing properties to meet the requirements for the manufacture of a cutting-edge semiconductor apparatus.

As to the resist under layer film composition having resistance to an alkali aqueous hydrogen peroxide, Patent Document 5 discloses a material that contains polymer having an epoxy group and a carboxyl group protected by a vinylether compound (acetal-protected ester), for use in a 2-layer process not using a resist middle layer film. However, this material has insufficient planarizing property and thus not suitable for patterning of a substrate to be processed having unevenness and steps, which particularly has high requirements in the cutting-edge process.

As mentioned above, it has been desired to develop a resist under layer film composition, for use in the manufacture of a semiconductor apparatus, having excellent filling and planarizing properties and dry etching property as well as compatibility with wet etching process (i.e., alkali aqueous hydrogen peroxide resistance), and a patterning process using the same.

PRIOR ART DOCUMENT

Patent Documents

Patent Document 1: Japanese Patent Laid-Open Publication No. 2004-205685
Patent Document 2: Japanese Patent Laid-Open Publication No. S61-180241
Patent Document 3: Japanese Patent No. 3082473
Patent Document 4: Japanese Patent No. 4310721
Patent Document 5: International Publication No. WO2015/030060

SUMMARY OF THE INVENTION

The present invention has been accomplished in view of the above circumstances, and an object thereof is to provide a polymer for a resist under layer film composition that is capable of forming a resist under layer film having good alkali aqueous hydrogen peroxide resistance, excellent filling and planarizing properties, and excellent dry etching property, and further provide a resist under layer film composition using the polymer and a patterning process using the composition.

To achieve the object, the present invention provides a polymer for a resist under layer film composition, comprising a repeating unit shown by the formula (1) and a repeating unit shown by the formula (3),

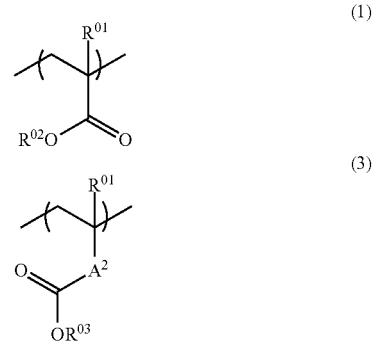

wherein $R^{01}$ independently represents a hydrogen atom or a methyl group; $R^{02}$ represents a group selected from the formulae (1-1) to (1-3); $R^{03}$ represents a saturated or unsaturated tertiary alkyl group having 4 to 20 carbon atoms and optionally containing an oxygen functional group; and $A^2$ represents a single bond or a divalent linking group having 2 to 10 carbon atoms and containing an ester group,

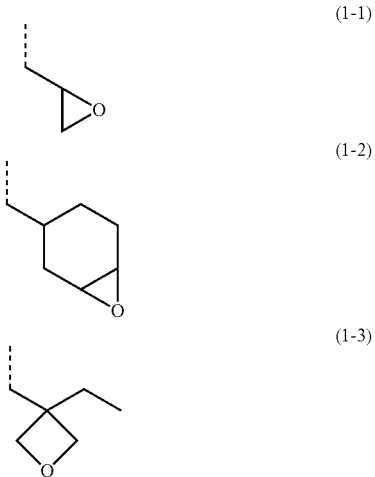

wherein the dotted line represents a bonding arm.

Such a polymer enables a resist under layer film composition containing this polymer as a base resin to have good alkali aqueous hydrogen peroxide resistance, excellent filling and planarizing properties, and excellent dry etching property.

It is preferred that a content of the repeating unit shown by the formula (1) be within a range of 20 mol % to 90 mol % with respect to the whole repeating units, and a content of the repeating unit shown by the formula (3) be within a range of 5 mol % to 50 mol % with respect to the whole repeating units.

The above contents enables a resist under layer film composition containing the polymer as a base resin to have more excellent alkali aqueous hydrogen peroxide resistance, thermosetting property, filling and planarizing properties, and dry etching property.

The repeating unit shown by the formula (3) is preferably a repeating unit shown by the formula (3-1),

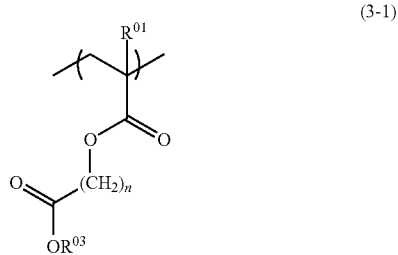

wherein $R^{01}$ and $R^{03}$ have the same meanings as above; n represents an integer of 1 to 5.

The polymer containing such a repeating unit is excellent in flexibility and has low carbon content. Therefore, a resist under layer film composition containing this polymer as a base resin can exhibit, in particular, excellent filling and planarizing properties and dry etching property. Moreover, better alkali aqueous hydrogen peroxide resistance can be achieved and the resist under layer film can be easily removed after dry etching.

The polymer for a resist under layer film composition preferably further comprises a repeating unit shown by the formula (2),

wherein $R^{01}$ has the same meaning as above; $A^1$ represents a single bond, an ester group, or a divalent linking group having 2 to 10 carbon atoms and containing an ester group; $Ar^1$ represents a substituted or unsubstituted aryl group having 6 to 20 carbon atoms.

The polymer containing such a repeating unit enables a resist under layer film composition containing the polymer as a base resin to have appropriate optical characteristics at a wavelength of 193 nm. Accordingly, when the composition is used for, in particular, a multilayer ArF lithography, reflective light during the exposure can be suppressed and the resolution of a resist upper layer film in the lithography can be improved.

A content of the repeating unit shown by the formula (2) is preferably within a range of 5 mol % to 50 mol % with respect to the whole repeating units.

When a resist under layer film composition containing the polymer with the above content as a base resin is used for, in particular, the multilayer ArF lithography, the resolution of the resist upper layer film in lithography can be improved.

A weight average molecular weight of the polymer is preferably within a range of 1,000 to 20,000.

The molecular weight within the above range enables a resist under layer film composition containing the polymer as a base resin to have good film-forming property, and inhibits sublimates from being generated during heat curing, thereby inhibiting the contamination of an apparatus due to the sublimates. In addition, coating defect can be inhibited and more excellent filling and planarizing properties can be achieved.

A glass transition temperature of the polymer is preferably 50° C. or lower.

The glass transition temperature within the above range enables a resist under layer film composition containing the polymer as a base resin to have more excellent filling and planarizing properties.

A dispersibility of the polymer is preferably 2.0 or less, the dispersibility being shown by a weight average molecular weight/a number average molecular weight of the polymer.

The dispersibility within the above range enables the reduction in sublimates caused when a resist under layer film is formed from a resist under layer film composition containing the polymer as a base resin, thereby further inhibiting the contamination of an apparatus due to the sublimates.

In addition, the present invention provides a resist under layer film composition for use in a multilayer resist method, comprising
(A) a base resin of the above polymer for a resist under layer film composition and
(B) an organic solvent.

Such a resist under layer film composition can form a resist under layer film having good alkali aqueous hydrogen peroxide resistance, excellent filling and planarizing properties, and excellent dry etching property.

The resist under layer film composition preferably further comprises one or more of (C) an acid generator, (D) a surfactant, (E) a crosslinking agent, (F) a plasticizer, and (G) a colorant.

If necessary, the inventive resist under layer film composition may contain additives as mentioned above to finely adjust the coating and film-forming property by spin coating, curing temperature, filling and planarizing properties, optical characteristics (light absorption characteristics) and so on.

The resist under layer film composition is preferably capable of forming a resist under layer film that is not peeled when the resist under layer film is formed on a silicon substrate and the silicon substrate is immersed in a 1.0 mass % aqueous hydrogen peroxide containing 0.5 mass % ammonia at 23° C. for 10 minutes.

Further, the resist under layer film composition is preferably capable of forming a resist under layer film that is not peeled when the resist under layer film is formed on a silicon substrate and the silicon substrate is immersed in a 1.0 mass % aqueous hydrogen peroxide containing 0.5 mass % ammonia at 65° C. for 5 minutes.

Such a resist under layer film composition has sufficient alkali aqueous hydrogen peroxide resistance, so that alternatives of the processable substrate to be processed and the removable resist middle layer film are increased.

In addition, the present invention provides a patterning process for forming a pattern in a substrate to be processed, the process comprising the steps of:
(I-1) forming a resist under layer film on the substrate to be processed by using the above resist under layer film composition;
(I-2) forming a resist upper layer film on the resist under layer film by using a photoresist composition;
(I-3) subjecting the resist upper layer film to pattern exposure and development with a developer to form a pattern in the resist upper layer film; and
(I-4) transferring the pattern to the resist under layer film by dry etching using the resist upper layer film having the formed pattern as a mask.

In addition, the present invention provides a patterning process for forming a pattern in a substrate to be processed, the process comprising the steps of:
(II-1) forming a resist under layer film on the substrate to be processed by using the above resist under layer film composition;
(II-2) forming a resist middle layer film on the resist under layer film;
(II-3) forming a resist upper layer film on the resist middle layer film by using a photoresist composition;
(II-4) subjecting the resist upper layer film to pattern exposure and development with a developer to form a pattern in the resist upper layer film;
(II-5) transferring the pattern to the resist middle layer film by dry etching using the resist upper layer film having the formed pattern as a mask; and
(II-6) transferring the pattern to the resist under layer film by dry etching using the resist middle layer film having the transferred pattern as a mask.

In addition, the present invention provides a patterning process for forming a pattern in a substrate to be processed, the process comprising the steps of:
(III-1) forming a resist under layer film on the substrate to be processed by using the above resist under layer film composition;
(III-2) forming an inorganic hard mask intermediate film selected from a silicon oxide film, a silicon nitride film, and silicon oxynitride film on the resist under layer film;
(III-3) forming an organic anti-reflective film on the inorganic hard mask intermediate film;
(III-4) forming a resist upper layer film on the organic anti-reflective film by using a photoresist composition;
(III-5) subjecting the resist upper layer film to pattern exposure and development with a developer to form a pattern in the resist upper layer film;
(III-6) transferring the pattern to the organic anti-reflective film and the inorganic hard mask intermediate film by dry etching using the resist upper layer film having the formed pattern as a mask; and
(III-7) transferring the pattern to the resist under layer film by dry etching using the inorganic hard mask intermediate film having the transferred pattern as a mask.

According to the inventive patterning processes, a fine pattern can be formed by the multilayer resist method (2-layer resist process, 3-layer resist process, or 4-layer resist process). Moreover, it is possible to fill steps on the body to be processed and planarize the substrate to be processed by forming the resist under layer film. Further, since the resist under layer film formed from the inventive resist under layer film composition has good alkali aqueous hydrogen peroxide resistance as mentioned above, it can be also applied to a wet etching process using an alkali aqueous hydrogen peroxide.

The inventive patterning process may further comprise, after the step (II-6), removing the resist middle layer film having the transferred pattern by wet etching with an alkali aqueous hydrogen peroxide.

Since the resist under layer film formed from the inventive resist under layer film composition has good alkali aqueous hydrogen peroxide resistance, the resist middle layer film can be removed by wet etching with an alkali aqueous hydrogen peroxide as mentioned above.

The inventive patterning process may further comprise, after the step (I-4), (II-6), or (III-7), transferring the pattern to the substrate to be processed by wet etching with an alkali aqueous hydrogen peroxide using the resist under layer film having the transferred pattern as a mask.

Since the resist under layer film formed from the inventive resist under layer film composition has good alkali aqueous hydrogen peroxide resistance, the pattern can be transferred to the substrate to be processed by wet etching with an alkali aqueous hydrogen peroxide as mentioned above.

The inventive patterning process may further comprise, after the step (I-4), (II-6), or (III-7), implanting an ion by using the resist under layer film having the transferred pattern as a mask to form the pattern in the substrate to be processed.

Such patterning processes are particularly suitable for implantation with ions into a substrate the surface of which is uneven.

The inventive patterning process may further comprise, after implanting the ion to form the pattern in the substrate to be processed, removing the resist middle layer film having the transferred pattern by wet etching with an alkali aqueous hydrogen peroxide.

Since the resist under layer film formed from the inventive resist under layer film composition has good alkali aqueous hydrogen peroxide resistance, the resist middle layer film can be removed by wet etching with an alkali aqueous hydrogen peroxide after pattern processing by ion implantation as mentioned above.

A dry etching rate of the resist under layer film is preferably higher than that of the resist upper layer film.

When such a resist under layer film composition is used, the resist under layer film used as a mask can be completely removed by dry etching. Therefore, a semiconductor apparatus with few defects can be manufactured.

The resist under layer film is preferably formed by applying the resist under layer film composition on the substrate to be processed and performing a heat treatment at 100° C. to 300° C. for 10 to 600 seconds.

Such conditions enable a flat resist under layer film to be formed without voids even on a substrate having unevenness, and can accelerate the crosslinking reaction, thereby preventing mixing with an overlying film. Moreover, by appropriately adjusting the heat treatment temperature and the heat treatment time within the above ranges, proper filling and planarizing properties and thermosetting property can be obtained according to the use.

The substrate to be processed is preferably a substrate having a structure or a step with a height of 30 nm or more.

Since the resist under layer film formed from the inventive resist under layer film composition has excellent filling and planarizing properties, the resist under layer film can be formed without voids even on a substrate having a structure or a step with a height of 30 nm or more.

As mentioned above, the inventive polymer for a resist under layer film composition enables a resist under layer film composition containing this polymer as a base resin to have good alkali aqueous hydrogen peroxide resistance, excellent filling and planarizing properties, and excellent dry etching property. Moreover, the adjustment of the kinds of the repeating units contained in the polymer, content of each repeating unit, kinds of functional groups in each repeating unit, molecular weight, dispersibility, or glass transition temperature of the polymer enables the resist under layer film composition to have desired characteristics. Moreover, addition of various additives allows fine adjustment of the coating and film-forming property by spin coating, curing temperature, filling and planarizing properties, optical characteristics (light absorption characteristics) and so on.

By using the inventive resist under layer film composition, a fine pattern can be formed by the multilayer resist method (e.g., 2-layer resist process, 3-layer resist process, or 4-layer resist process). Moreover, since the resist under layer film formed from the inventive resist under layer film composition has excellent filling and planarizing properties, a flat resist under layer film can be formed without voids even on a substrate having unevenness. Moreover, since the resist under layer film formed from the inventive resist under layer film composition has good alkali aqueous hydrogen peroxide resistance, the removal of the resist middle layer film and the pattern transfer to the substrate to be processed can be performed by wet etching process with an alkali aqueous hydrogen peroxide. Moreover, since the resist under layer film formed from the inventive resist under layer film composition has excellent etching property, the resist under layer film used as a mask can be completely removed by dry etching. Consequently, a semiconductor apparatus with few defects can be manufactured.

DETAILED DESCRIPTION OF THE PREFERRED EMBODIMENTS

Figure 1:
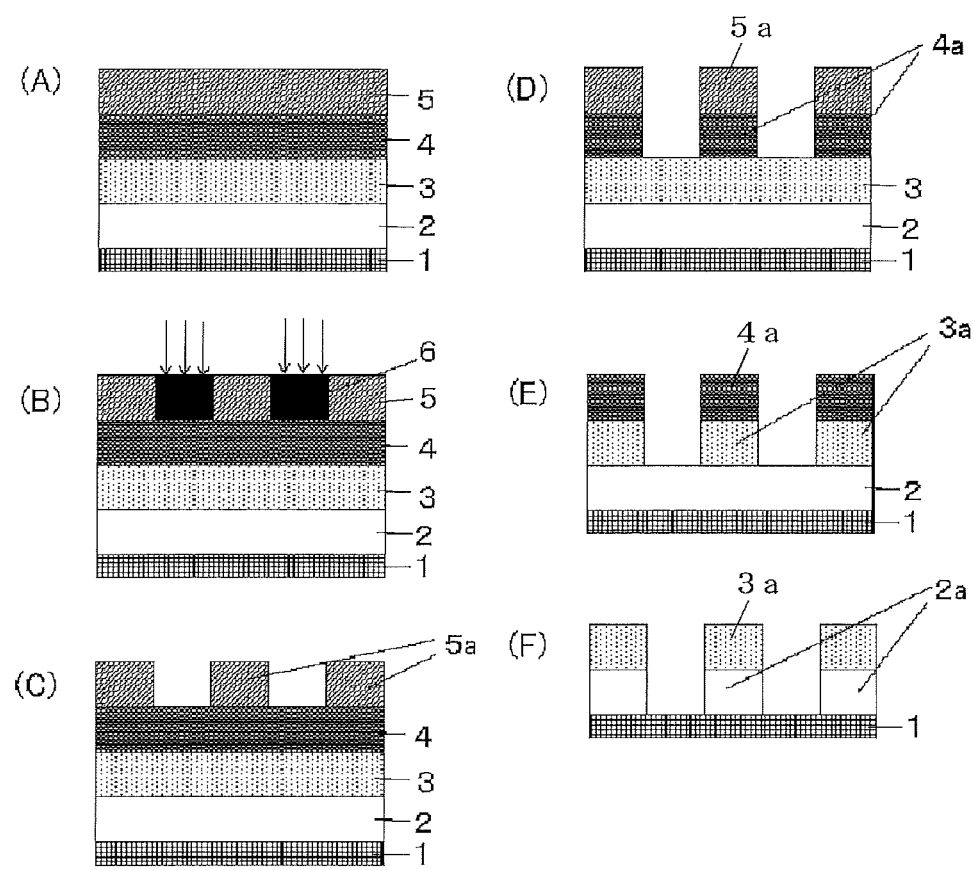
FIG. 1 is an explanatory view of an example of the inventive patterning process by 3-layer resist process.

As mentioned above, it has been desired to develop a resist under layer film composition, for use in the manufacture of a semiconductor apparatus, having excellent filling and planarizing properties and dry etching property as well as compatibility with wet etching process (i.e., alkali aqueous hydrogen peroxide resistance), and a patterning process using the same.

The present inventors have earnestly investigated on the above objects, and consequently found that the object can be accomplished by a resist under layer film composition that contains a base resin of the polymer having a specific structure and a patterning process using this resist under layer film composition, thereby bringing the present invention to completion.

That is, the present invention is directed to a polymer for a resist under layer film composition, comprising a repeating unit shown by the formula (1) and a repeating unit shown by the formula (3),

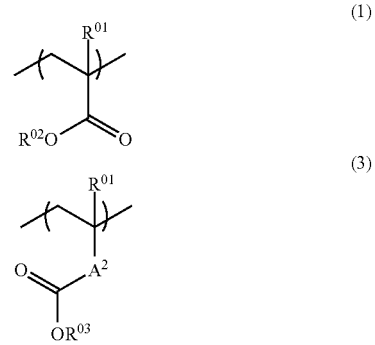

wherein $R^{01}$ independently represents a hydrogen atom or a methyl group; $R^{02}$ represents a group selected from the formulae (1-1) to (1-3); $R^{03}$ represents a saturated or unsaturated tertiary alkyl group having 4 to 20 carbon atoms and optionally containing an oxygen functional group; and $A^2$ represents a single bond or a divalent linking group having 2 to 10 carbon atoms and containing an ester group,

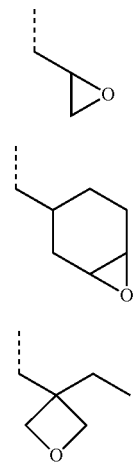

wherein the dotted line represents a bonding arm.

Hereinafter, the present invention will be described in detail, but the present invention is not limited thereto. Herein, "Me" represents a methyl group, "Ph" represents a phenyl group, and "tBu" represents a tert-butyl group.

<Polymer for Resist Under Layer Film Composition>

The inventive polymer for a resist under layer film composition contains a repeating unit shown by the formula (1) (also referred to as "repeating unit (1)" below) and a repeating unit shown by the formula (3) (also referred to as "repeating unit (3)" below) as essential components.

[Repeating Unit (1)]

The repeating unit (1) has an effect of providing thermosetting property to the polymer. When the polymer containing the repeating unit (1) is used as a base resin of a resist under layer film composition, a resist under layer film can be cured by heating after applying the composition, thereby preventing intermixing with a film to be formed on the resist under layer film. Moreover, the repeating unit (1) is supposed to contribute to the alkali aqueous hydrogen peroxide resistance, to some extent.

In the formula (1), $R^{01}$ represents a hydrogen atom or a methyl group. When $R^{01}$ is a hydrogen atom, the polymer is excellent in flowability, so that a resist under layer film composition containing the polymer as a base rein can exhibit excellent filling and planarizing properties. In addition, when $R^{01}$ is a hydrogen atom, the carbon content of the polymer is lowered. Therefore, the resist under layer film composition containing the polymer as a base rein can exhibit excellent etching rate. On the other hand, when $R^{01}$ is a methyl group, a resist under layer film composition containing the polymer as a base rein is excellent in coating and film-forming property.

In the formula (1), $R^{01}$ represents a group selected from the formulae (1-1) to (1-3). Specifically, the repeating unit (1) is selected from the following.

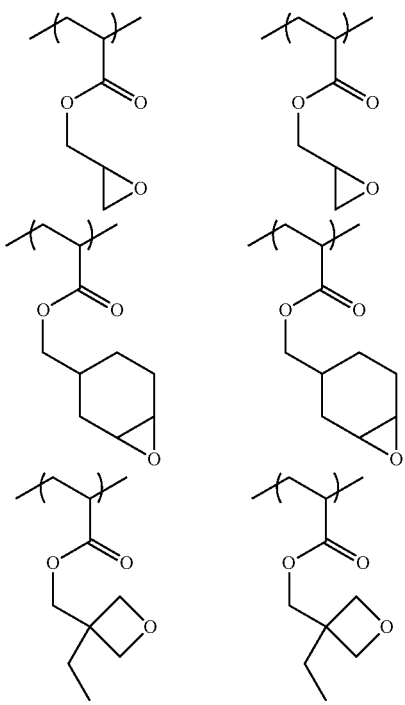

The repeating unit (1) contained in the inventive polymer for a resist under layer film composition may be one kind or two or more kinds. The content of the repeating unit (1) is preferably within a range of 20 mol % to 90 mol %, more preferably 25 mol % to 70 mol %, with respect to the whole repeating units. When the content of the repeating unit (1) is 20 mol % or more, sufficient thermosetting property can be obtained more surely. When the content is 90 mol % or less, more excellent filling and planarizing properties and etching property can be achieved.

[Repeating Unit (3)]

The repeating unit (3) has an effect of improving the alkali aqueous hydrogen peroxide resistance of the polymer. In the formula (3), $R^{01}$ represents a hydrogen atom or a methyl group. $R^{03}$ represents a saturated or unsaturated tertiary alkyl group having 4 to 20 carbon atoms and may contain an oxygen functional group. Illustrative examples of $R^{03}$ include the following, but it is not limited thereto.

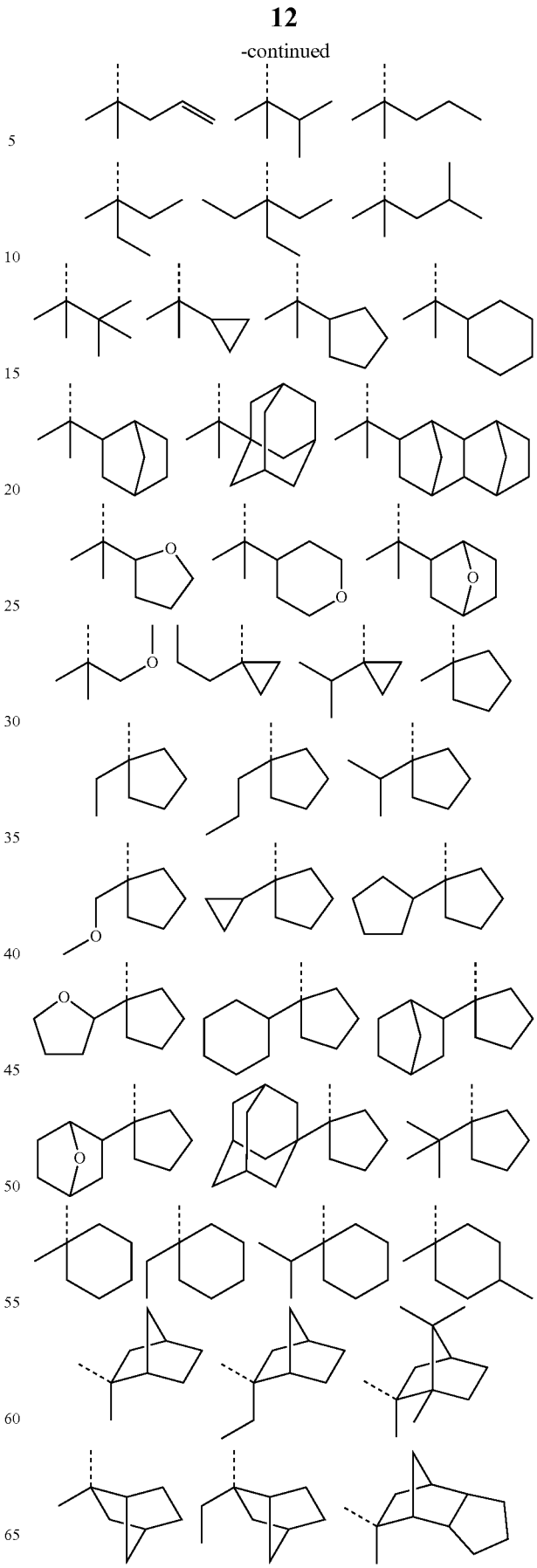

-continued

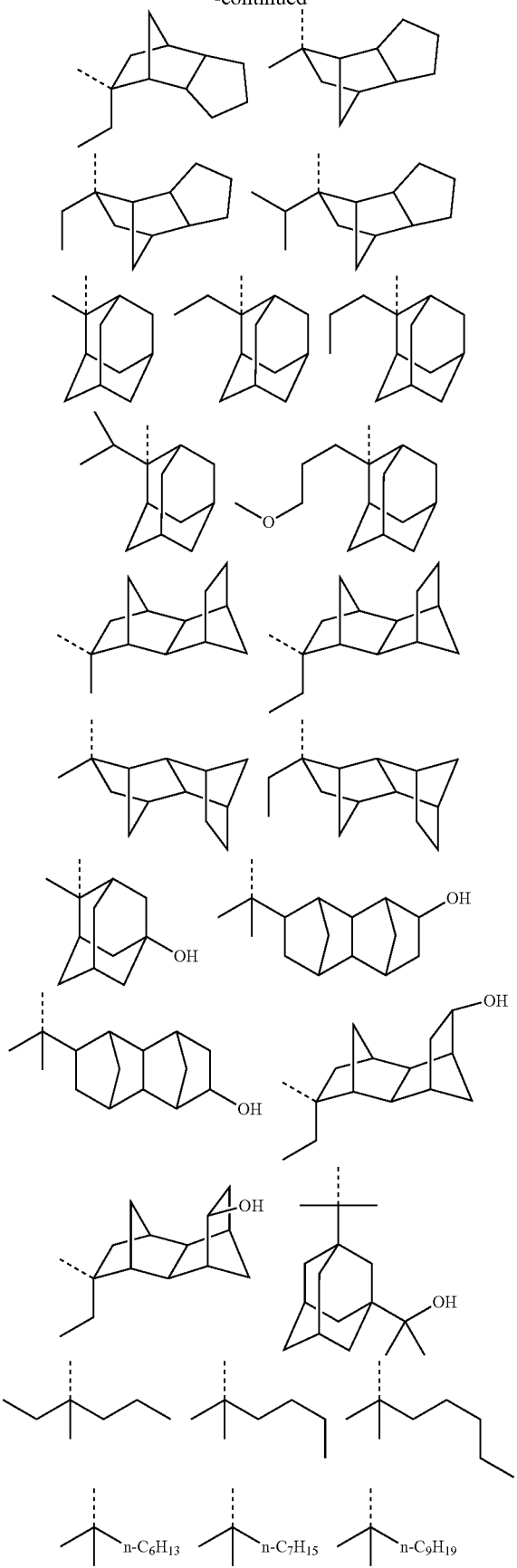

-continued

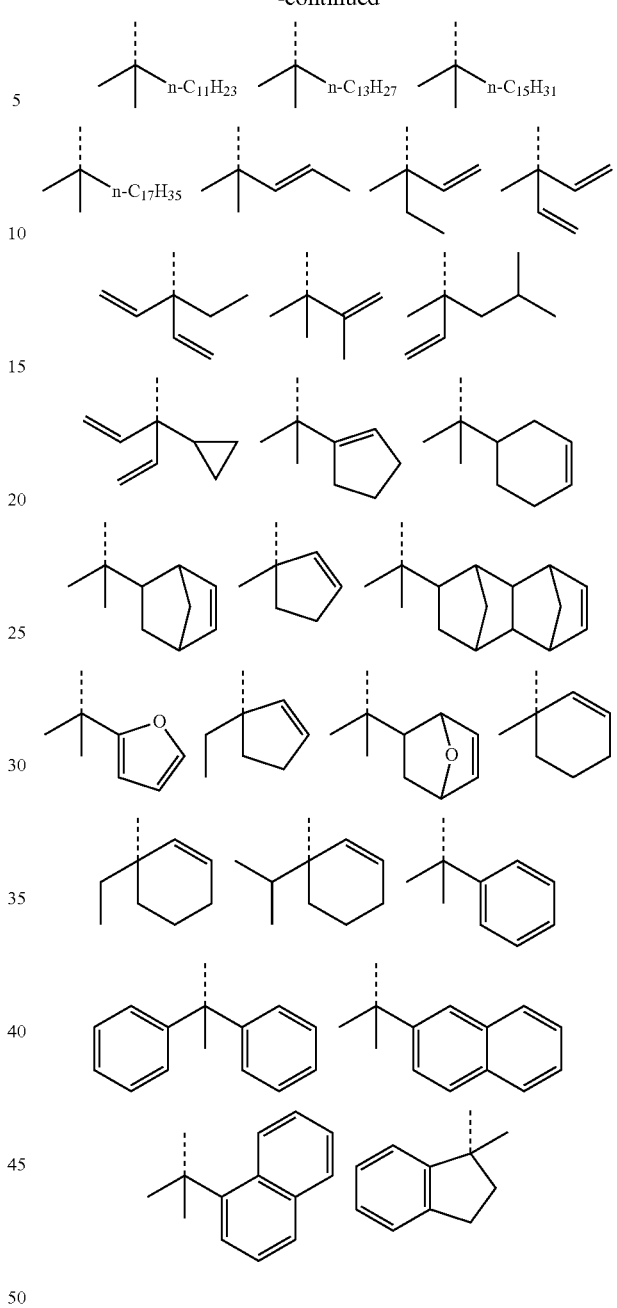

In the general formula (3), $A^2$ represents a single bond or a divalent linking group having 2 to 10 carbon atoms and containing an ester group ($-CO_2-$). Illustrative examples of $A^2$ include a single bond, $-CO_2CH_2-$, $-CO_2CH_2CH_2-$, $-CO_2CH_2CH_2CH_2-$, $-CO_2CH(CH_3)-$, $-CO_2CH_2CH_2CH_2CH_2-$, $-CO_2CH_2CH_2CH_2CH_2CH_2CH_2-$, $-CO_2CH_2CH_2CH_2CH_2CH_2CH_2CH_2CH_2CH_2-$, $-CO_2CH_2CH_2O-$, $-CO_2CH_2CH_2OCH_2CH_2O-$, and $-CO_2CH_2CH_2OCH_2CH_2OCH_2CH_2O-$. Among them, $-CO_2CH_2-$, $-CO_2CH_2CH_2-$, $-CO_2CH_2CH_2CH_2-$, $-CO_2CH_2CH_2CH_2CH_2-$, and $-CO_2CH_2CH_2CH_2CH_2CH_2CH_2-$ are particularly preferable. That is, the repeating unit (3) is preferably a repeating unit shown by the formula (3-1) (also referred to as "repeating unit (3-1)" below),

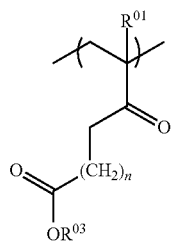

(3-1)

wherein $R^{01}$ and $R^{03}$ have the same meanings as above; n represents an integer of 1 to 5.

The polymer containing the repeating unit (3-1) is excellent in flexibility and has low carbon content. Therefore, a resist under layer film composition containing this polymer as a base resin can exhibit, in particular, excellent filling and planarizing properties and etching property. Moreover, better alkali aqueous hydrogen peroxide resistance can be achieved and the resist under layer film can be easily removed after dry etching.

When the polymer that contains the repeating unit (3) or the repeating unit (3-1) is used a base resin of a resist under layer film composition to form a resist under layer film, elimination and decomposition reaction of the tertiary alkyl group $R^{03}$ proceeds by, for example, the effect of an acid generated from a later-described (C) acid generator, thereby generating a carboxylic acid. The generated carboxylic acid causes ring-opening addition reaction with the repeating unit (1) to form a specific hydroxyester crosslinking structure. The following schema shows a typical example of the reaction of the repeating unit (3) and the repeating unit (1') (a repeating unit (1) having the structure shown by the formula (1-1)). In the following schema, the formula (4) shows a carboxylic acid formed by eliminating $R^{03}$ in the repeating unit (3), and the formula (5) shows a product in which the hydroxyester crosslinking structure is formed. The portion surrounded with the dotted line is the hydroxyester crosslinking structure formed by the reaction.

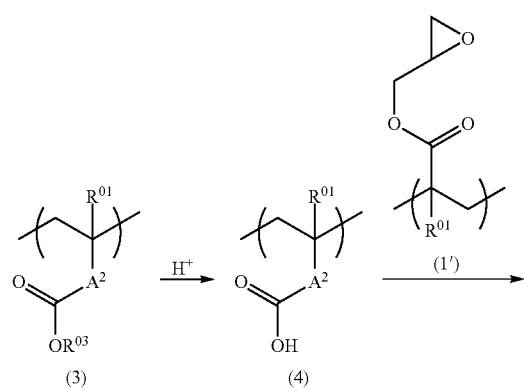

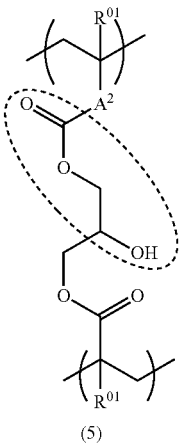

(5)

wherein $R^{01}$, $R^{03}$, and $A^2$ have the same meanings as above.

The formation of the hydroxyester crosslinking structure contributes to the increase in molecular weight of the base resin in the resist under layer film composition and to the expression of the solvent resistance of the resist under layer film. Moreover, since the hydroxyester crosslinking structure has high affinity with a substrate, the presence of the repeating unit (3) or the repeating unit (3-1) is supposed to improve the adhesion of the resist under layer film to the substrate and contribute to the improvement of the alkali aqueous hydrogen peroxide resistance. Theoretically, it is also possible to introduce the hydroxyester crosslinking structure into the base resin prior to crosslinking. In this case, however, there is disadvantage that the filling and planarizing properties in the film formation are remarkably lowered. Thus, the composition is favorably configured to form the hydroxyester crosslinking structure during the crosslinking reaction of the base resin, like the present invention.

In other words, the inventive polymer for a resist under layer film composition does not have a high-polar group such as alcoholic hydroxyl group and carboxyl group, which is supposed to be a cause of lowering the planarizing property, before baking. The filling and planarization are performed before the elimination and decomposition reaction of the tertiary alkyl group $R^{03}$ is started during baking. This is supposed to be the reason why the resist under layer film composition containing this polymer as a base resin can improve the filling and planarizing properties. By contrast, if $R^{03}$ were not a tertiary alkyl group but an acetal group derived from a vinylether compound, the acetal group would be decomposed to generate a carboxyl group before the completion of filling and planarization due to its low stability, consequently lowering the filling and planarizing properties of the resist under layer film composition.

The repeating unit (3) contained in the inventive polymer for a resist under layer film composition may be one kind or two or more kinds. The content of the repeating unit (3) is preferably within a range of 5 mol % to 50 mol %, more preferably 10 mol % to 40 mol %, with respect to the whole repeating units. When the content of the repeating unit (3) is within the range of 5 mol % to 50 mol %, the alkali aqueous hydrogen peroxide resistance of the polymer can be further improved, so that it is preferable.

When the total content of the repeating unit (1) and the repeating unit (3) is less than 100 mol %, the inventive polymer for a resist under layer film composition contains other repeating unit. Examples of such a repeating unit is not particularly limited, but include a later-described repeating unit shown by the formula (2) (also referred to as "repeating unit (2)") and repeating units derived from α,β-unsaturated carboxylates such as other acrylate, other methacrylate, crotonate, maleate, and itaconate; α,β-unsaturated carboxylic acids such as methacrylic acid, acrylic acid, maleic acid, and itaconic acid; acrylonitrile; methacrylonitrile; α,β-unsaturated lactones such as 5,5-dimethyl-3-methylene-2-oxotetrahydrofuran; cyclic olefins such as norbornene derivatives and tetracyclo[4.4.0.1$^{2,5}$.1$^{7,10}$]dodecene derivatives; α,β-unsaturated carboxylic anhydrides such as maleic anhydride and itaconic anhydride; allyl ethers; vinyl ethers; vinyl esters; and vinyl silanes.

[Repeating Unit (2)]

The inventive polymer for a resist under layer film composition preferably contains a repeating unit shown by the formula (2),

(2)

wherein R$^{01}$ has the same meaning as above; A$^1$ represents a single bond, an ester group, or a divalent linking group having 2 to 10 carbon atoms and containing an ester group; Ar$^1$ represents a substituted or unsubstituted aryl group having 6 to 20 carbon atoms.

The repeating unit (2) provides the polymer with appropriate optical characteristics at a wavelength of 193 nm. Thus, when the polymer contains the repeating unit (2) and a resist under layer film composition containing this polymer as a base resin is used in, particularly, the multilayer ArF lithography, reflective light during the exposure can be suppressed and the resolution can be improved. For suppressing reflective light, the resist under layer film composition preferably has optical constants as follows: refractive index n is within a range of 1.5 to 1.9; extinction coefficient k is within a range of 0.1 to 0.5.

In the formula (2), R$^{01}$ represents a hydrogen atom or a methyl group. A$^1$ represents a single bond, an ester group (—CO$_2$—), or a divalent linking group having 2 to 10 carbon atoms and containing an ester group. Illustrative examples of A$^1$ include a single bond, —CO$_2$—, —CO$_2$CH$_2$—, —CO$_2$CH$_2$CH$_2$—, —CO$_2$CH$_2$CH$_2$CH$_2$—, —CO$_2$CH(CH$_3$)—, —CO$_2$CH$_2$CH$_2$CH$_2$CH$_2$—, —CO$_2$CH$_2$CH$_2$CH$_2$CH$_2$CH$_2$CH$_2$CH$_2$CH$_2$—, —CO$_2$CH$_2$CH$_2$O—, —CO$_2$CH$_2$CH$_2$OCH$_2$CH$_2$O—, and —CO$_2$CH$_2$CH$_2$OCH$_2$CH$_2$OCH$_2$CH$_2$O—, but it is not limited thereto.

Ar$^1$ represents a substituted or unsubstituted aryl group having 6 to 20 carbon atoms. Illustrative examples of Ar$^1$ include a phenyl group, a tolyl group, a xylyl group, a methoxyphenyl group, a tert-butoxyphenyl group, a hydroxyphenyl group, an acetylphenyl group, a naphthyl group, a methylnaphthyl group, an anthracenyl group, a phenanthrenyl group, and a pyrenyl group. In particular, a phenyl group and a tert-butoxyphenyl group are preferable, but it is not limited thereto.

When the inventive polymer for a resist under layer film composition contains the repeating unit (2), the repeating unit (2) contained may be one kind or two or more kinds. In addition, when the repeating unit (2) is contained, the content thereof is preferably within a range of 5 mol % to 50 mol %, more preferably 5 mol % to 40 mol %, with respect to the whole repeating units. When the content of the repeating unit (2) is 5 mol % or more, good resolution can be achieved in the lithography of a resist upper layer film. When the content is 50 mol % or less, good etching property can be achieved, so that it is preferable.

The weight average molecular weight of the inventive polymer for a resist under layer film composition is preferably within a range of 1,000 to 20,000, more preferably 1,500 to 15,000, much more preferably 2,000 to 10,000. Herein, the "weight average molecular weight" is a value measured by gel permeation chromatography (GPC) using tetrahydrofuran as a solvent and polystyrene as a reference material. When the weight average molecular weight is 1,000 or more, a resist under layer film composition containing the polymer as a base resin has good film-forming property and sublimate generation during heat curing can be inhibited, thereby inhibiting the contamination of an apparatus due to the sublimates. In addition, when the weight average molecular weight is 20,000 or less, generation of coating defect can be inhibited in the resist under layer film composition containing the polymer as a base resin, and more excellent filling and planarizing properties can be achieved because of good flowability.

The glass transition temperature of the inventive polymer for a resist under layer film composition is preferably 50° C. or lower, more preferably 25° C. or lower. The polymer having the glass transition temperature within the above range enables a resist under layer film composition containing this polymer as a base resin to have more excellent filling and planarizing properties, so that it is particularly suitable for processing a substrate the surface of which is uneven.

In addition, the inventive polymer for a resist under layer film composition preferably has a dispersibility shown by weight average molecular weight/number average molecular weight of 2.0 or less, more preferably 1.8 or less. Herein, the "dispersibility" is a value calculated from the weight average molecular weight and the number average molecular weight obtained by GPC mentioned above. The polymer having such a dispersibility enables inhibition of sublimates generation caused when a resist under layer film composition containing the polymer as a base resin is thermally cured, thereby inhibiting the contamination of an apparatus due to the sublimates. Thus, this polymer is excellently practical.

Illustrative examples of the inventive polymer for a resist under layer film composition are shown below, but the inventive polymer for a resist under layer film composition is not limited thereto.

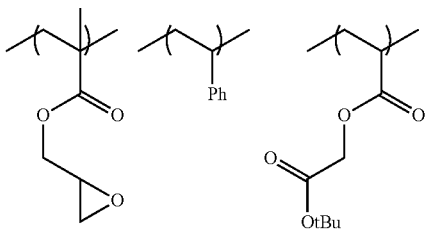

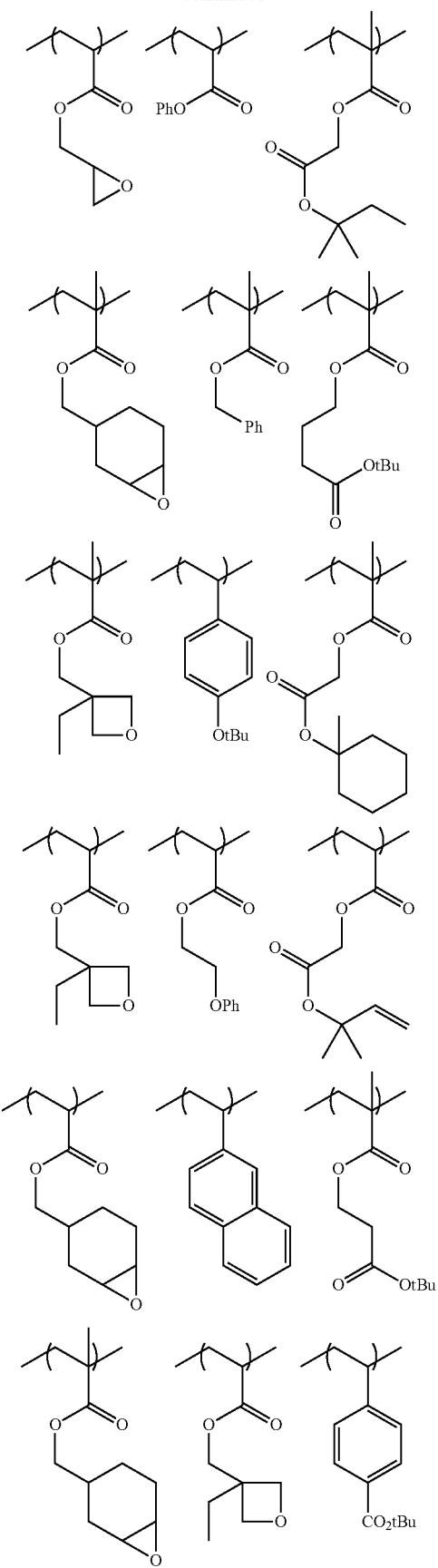
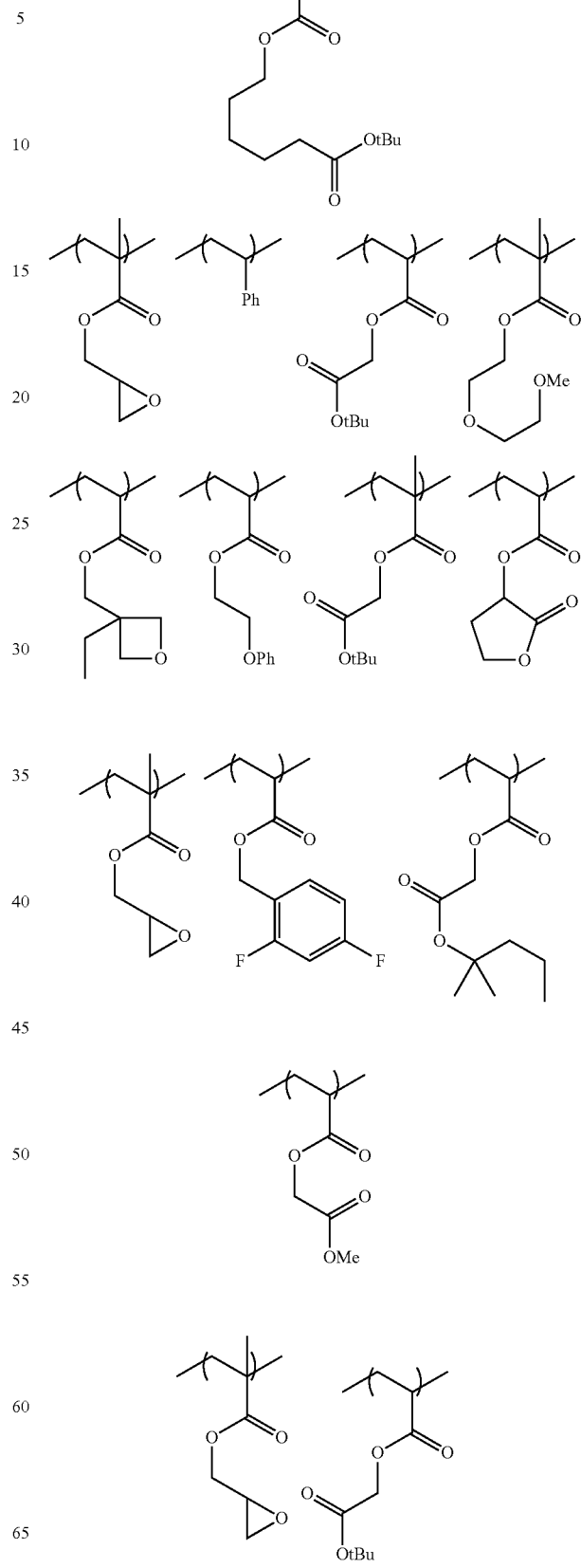

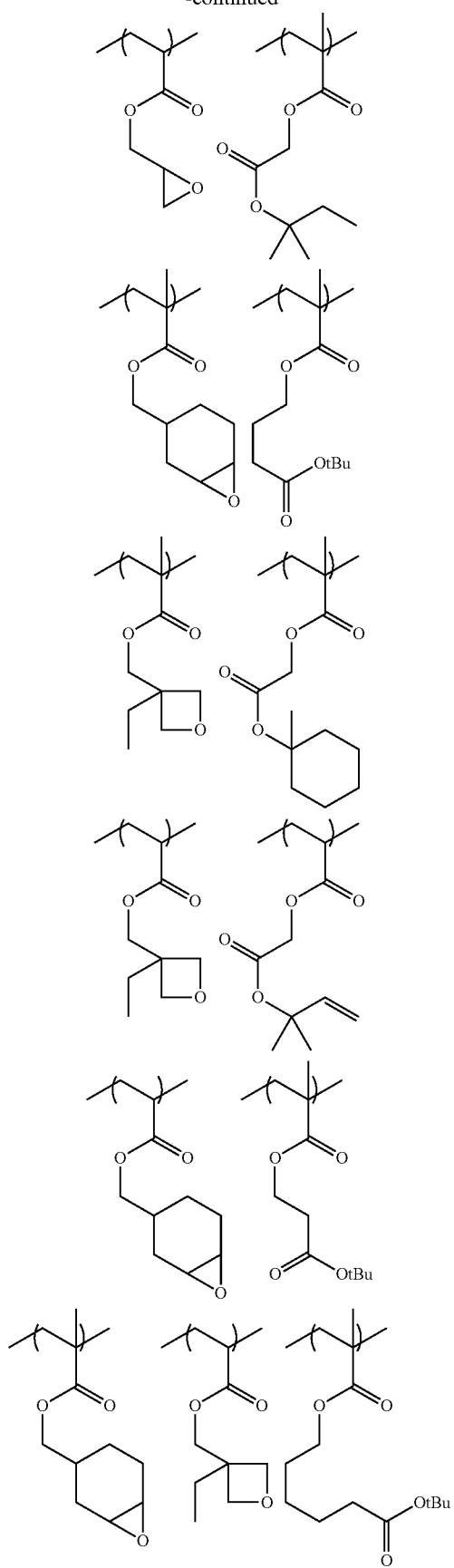
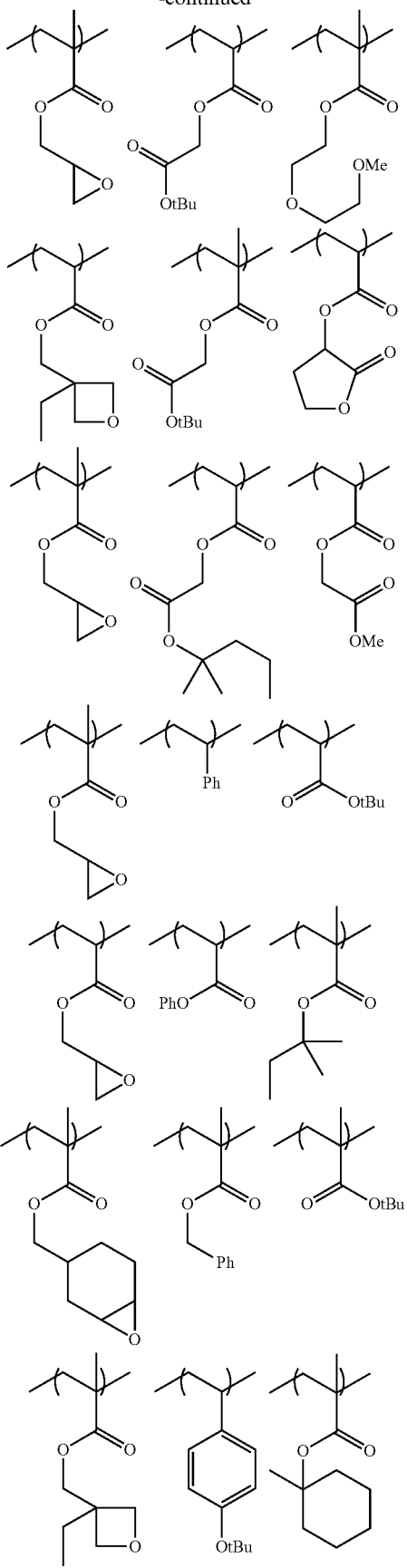

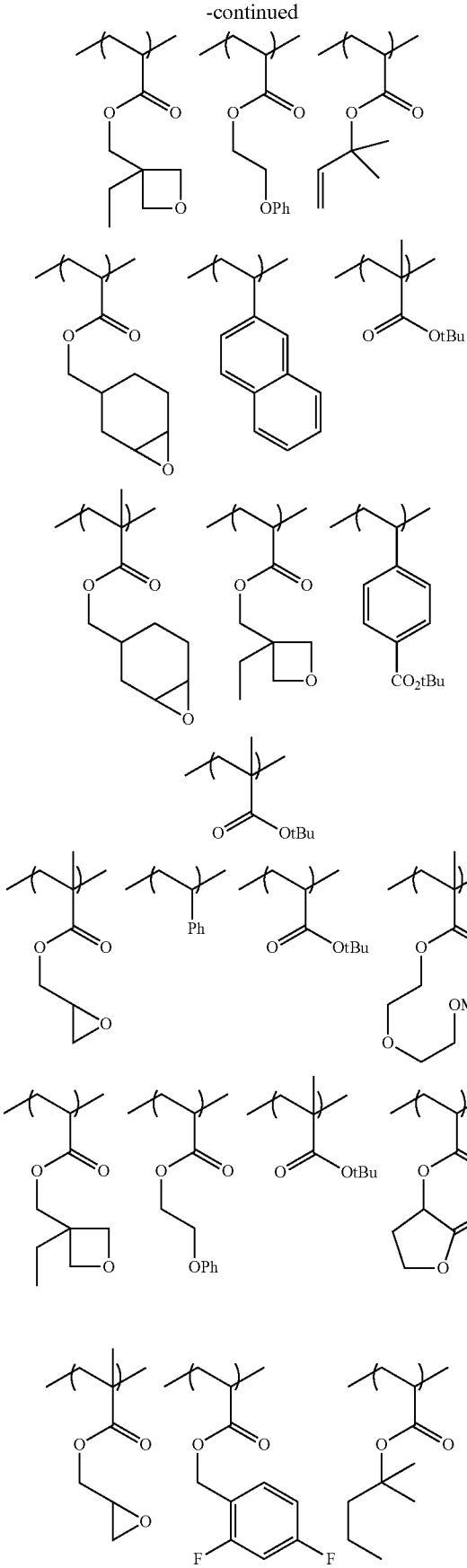

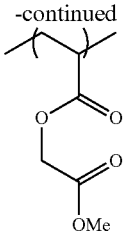

An exemplary method of synthesizing the inventive polymer for a resist under layer film composition is to mix monomers having polymerizable unsaturated bond corresponding to each repeating unit, and perform heat polymerization in the presence of a radical polymerization initiator in a solvent. According to this method, the polymer can be obtained. The polymerization conditions are appropriately selected according to monomers to be used, target molecular weight, etc., and not particularly restricted. Illustrative examples of the solvent used in the polymerization include toluene, benzene, tetrahydrofuran, diethyl ether, dioxane, 2-butanone, methylisobutyl ketone, propylene glycol monomethyl ether acetate, cyclohexanone, γ-butyrolactone, ethyl acetate, and butyl acetate. Illustrative examples of the polymerization initiator include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Further, as a chain transfer agent, thiols such as octanethiol and 2-mercaptoethanol may be added in the polymerization. The polymerization reaction is preferably carried out by heating at 40° C. to the boiling point of the reaction solvent. The reaction time is preferably 0.5 to 100 hours, more preferably 1 to 48 hours.

For example, a polymer for a resist under layer film composition containing the repeating units (1), (2), and (3-1) can be synthesized by the polymerization using, as monomers, the compounds having polymerizable double bond, shown by the following formulae (1a), (2a), and (3-1a).

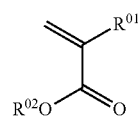

(1a)

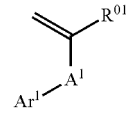

(2a)

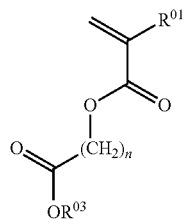

(3-1a)

wherein $R^{01}$, $R^{02}$, $R^{03}$, $A^1$, $Ar^1$, and n have the same meanings as above.

In the polymerization, all of the raw materials may be mixed and then heated, or a part of the raw materials may be heated and then the remainder may be added thereto separately or as a mixture, at once or gradually. For example, a polymerization solvent may be heated alone, and a monomer solution and a polymerization initiator solution may be added thereto separately and gradually. This polymerization method is particularly preferable since a polymer relatively homogeneous can be obtained and abnormal reaction such as runaway reaction can be prevented.

The polymer solution thus obtained may be directly blended into the resist under layer film composition, or if necessary, may be purified by a conventional method such as crystallization, liquid-separation, filtration, and concentration to remove impurities including a remaining monomer, a remaining solvent, by-product, and so forth. In the case that the inventive polymer for a resist under layer film composition is purified, the following two methods are preferable: the crystallization method in which a poor solvent such as water, water-containing alcohol, or a saturated hydrocarbon is added to the polymer solution to collect the precipitation by filtration; the separation method in which the poor solvent layer is separated and removed. Among them, the separation method is particularly preferable. When the polymer is purified by the separation method, components having low molecular weight can be efficiently removed from the polymer solution. Accordingly, the generation of sublimates can be reduced when a resist under layer film is formed from the resist under layer film composition containing the polymer. As a result, the contamination of a film-forming apparatus can be prevented.

The inventive polymer for a resist under layer film composition as mentioned above enables a resist under layer film composition containing this polymer as a base resin to have good alkali aqueous hydrogen peroxide resistance, excellent filling and planarizing properties, and excellent dry etching property. Moreover, the adjustment of the kinds of the repeating units contained in the polymer, content of each repeating unit, kinds of functional groups in each repeating unit, molecular weight, dispersibility, or glass transition temperature of the polymer enables the resist under layer film composition to have desired characteristics.

<Resist Under Layer Film Composition>

In addition, the present invention provides a resist under layer film composition for use in a multilayer resist method, containing (A) a base resin of the above polymer for a resist under layer film composition, and (B) an organic solvent.

[(A) Base Resin]

The inventive resist under layer film composition contains the inventive polymer for a resist under layer film composition as a base resin. The polymer contained in the inventive resist under layer film composition may be one kind or two or more kinds. In addition, the inventive resist under layer film composition may further contain a resin other than the inventive polymer for a resist under layer film composition (i.e., a resin not containing the repeating unit (1) and/or the repeating unit (3)). Such a resin is not particularly limited, and may be a known resin. Preferable examples thereof include an acrylic resin, a styrene resin, a phenol resin, a polyether resin, and an epoxy resin.

[(B) Organic Solvent]

The inventive resist under layer film composition contains an organic solvent. The organic solvent is not particularly limited provided that the solvent can dissolve (A) the base resin. When additives such as (C) an acid generator, (D) a surfactant, (E) a crosslinking agent, (F) a plasticizer, and (G) a colorant are added, the solvent preferably also dissolve these additives. Illustrative examples of the solvent that can be added include solvents disclosed in paragraphs (0091) and (0092) in Japanese Patent Laid-Open Publication No. 2007-199653. Above all, propylene glycol monomethyl ether acetate, propylene glycol monomethyl ether, propylene glycol monoethyl ether, propylene glycol monopropyl ether, 2-heptanone, cyclopentanone, cyclohexanone, γ-butyrolactone, and a mixture of two or more kinds thereof are preferably used.

The inventive resist under layer film composition may contain, in addition to (A) the base resin and (B) the organic solvent, one or more of (C) an acid generator, (D) a surfactant, (E) a crosslinking agent, (F) a plasticizer, and (G) a colorant. Each component (C) to (G) will now be described in detail.

[(C) Acid Generator]

To the inventive resist under layer film composition, an acid generator may be added to further promote the crosslinking reaction by heat, etc. The acid generator includes a material which generates an acid by heat decomposition and a material which generates an acid by photo-irradiation. Either acid generator may be added to the inventive resist under layer film composition.

The acid generator usable in the inventive resist under layer film composition is not particularly limited. Examples thereof include the following:

i. an onium salt shown by the formula (P1a-1), (P1α-2), (P1α-3), or (P1b);
ii. a diazomethane derivative shown by the formula (P2);
iii. a glyoxime derivative shown by the formula (P3);
iv. a bissulfone derivative shown by the formula (P4);
v. a sulfonate derivative of a N-hydroxyimide compound, shown by the formula (P5);
vi. a β-ketosulfonic acid derivative;
vii. a disulfone derivative;
viii. a nitrobenzylsulfonate derivative; and
ix. a sulfonate derivative.

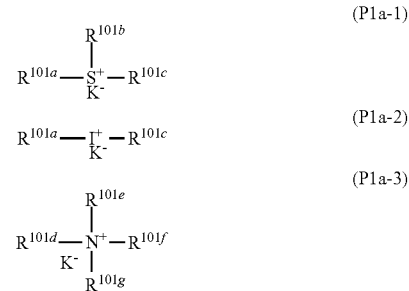

wherein $R^{101a}$, $R^{101b}$, and $R^{101c}$ independently represent a linear, branched, or cyclic alkyl, alkenyl, oxoalkyl or oxoalkenyl group having 1 to 12 carbon atoms, an aryl group having 6 to 20 carbon atoms, or an aralkyl or aryloxoalkyl group having 7 to 12 carbon atoms, where a part or all of hydrogen atoms of these groups may be substituted by an alkoxy or other group(s); $R^{101b}$ and $R^{101c}$ may form a ring, and when the ring is formed, $R^{101b}$ and $R^{101c}$ each represent an alkylene group having 1 to 6 carbon atoms; $K^-$ represents a non-nucleophilic counter ion; $R^{101d}$, $R^{101e}$, $R^{101f}$, and $R^{101g}$ represents the same as $R^{101a}$, $R^{101b}$, and $R^{101c}$ as well as a hydrogen atom; a pair of $R^{101d}$ and $R^{101e}$ or a combination of $R^{101d}$, $R^{101e}$, and $R^{101f}$ may form a ring, and when the ring is formed, each of $R^{101d}$ and $R^{101e}$ or each of $R^{101d}$, $R^{101e}$, and $R^{101f}$ represents an alkylene group having 3 to 10 carbon atoms or they may form a heterocyclic aromatic ring including the nitrogen atom shown in the formula.

$R^{101a}$, $R^{101b}$, $R^{101c}$, $R^{101d}$, $R^{101e}$, $R^{101f}$, and $R^{101g}$ may be the same or different. Examples of the alkyl group include a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, and an adamantyl group. Examples of the alkenyl group include a vinyl group, an allyl group, a propenyl group, a butenyl group, a hexenyl group, and a cyclohexenyl group. Examples of the oxoalkyl group include a 2-oxocyclopentyl group, a 2-oxocyclohexyl group, a 2-oxopropyl group, a 2-cyclopentyl-2-oxoethyl group, a 2-cyclohexyl-2-oxoethyl group, and a 2-(4-methylcyclohexyl)-2-oxoethyl group. Examples of the oxoalkenyl group include a 2-oxo-4-cyclohexenyl group and a 2-oxo-4-propenyl group. Examples of the aryl group include a phenyl group and a naphthyl group; alkoxyphenyl groups such as a p-methoxyphenyl group, a m-methoxyphenyl group, an o-methoxyphenyl group, an ethoxyphenyl group, a p-tert-butoxyphenyl group, and a m-tert-butoxyphenyl group; alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group; alkylnaphthyl groups such as a methylnaphthyl group and an ethylnaphthyl group; alkoxynaphthyl groups such as a methoxynaphthyl group and an ethoxynaphthyl group; dialkylnaphthyl groups such as a dimethylnaphthyl group and a diethylnaphthyl group; and dialkoxynaphthyl groups such as a dimethoxynaphthyl and a diethoxynaphthyl. Examples of the aralkyl group include a benzyl group and a phenethyl group. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group. Examples of the non-nucleophilic counter ion $K^-$ include halide ions such as chloride ions and bromide ions; fluoroalkylsulfonates such as triflate, 1,1,1-trifluoroethanesulfonate, and nonafluorobutanesulfonate; arylsulfonates such as tosylate, benzenesulfonate, 4-fluorobenzenesulfonate, and 1,2,3,4,5-pentafluorobenzenesulfonate; alkylsulfonates such as mesylate and butanesulfonate; imide acids such as bis(trifluoromethylsulfonyl)imide, bis(perfluoroethylsulfonyl)imide, and bis(perfluorobutylsulfonyl)imide; methide acids such as tris(trifluoromethylsulfonyl)methide and tris(perfluoroethylsulfonyl)methide; sulfonates whose α-position is fluoro-substituted, shown by the formula (K-1); and sulfonates whose α-position and β-position are fluoro-substituted, shown by the formula (K-2).

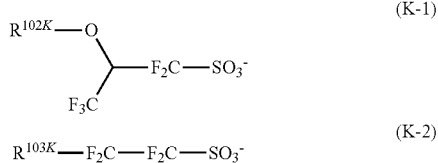

In the formula (K-1), $R^{102K}$ represents a hydrogen atom, a linear, branched, or cyclic alkyl or acyl group having 1 to 20 carbon atoms, an alkenyl group having 2 to 20 carbon atoms, or an aryl or aryloxy group having 6 to 20 carbon atoms. In the formula (K-2), $R^{103K}$ represents a hydrogen atom, a linear, branched, or cyclic alkyl group having 1 to 20 carbon atoms, an alkenyl group having 2 to 20 carbon atoms, or an aryl group having 6 to 20 carbon atoms.

Examples of the heterocyclic aromatic ring formed by $R^{101d}$, $R^{101e}$, $R^{101f}$, and $R^{101g}$ with the nitrogen atom shown in the formula, include imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

The salts of (P1a-1) and (P1a-2) have both the functions of a photo acid generator and a thermal acid generator while the salts of (P1a-3) function as a thermal acid generator.

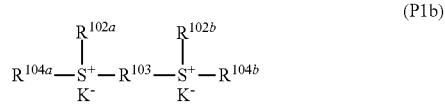

(P1b)

wherein $R^{102a}$ and $R^{102b}$ independently represent a linear, branched, or cyclic alkyl group having 1 to 8 carbon atoms; $R^{103}$ represents a linear, branched, or cyclic alkylene group having 1 to 10 carbon atoms; $R^{104a}$ and $R^{104b}$ independently represent a 2-oxoalkyl group having 3 to 7 carbon atoms; $K^-$ represents a non-nucleophilic counter ion.

Examples of the alkyl group $R^{102a}$ and $R^{102b}$ include a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cyclopropylmethyl group, a 4-methylcyclohexyl group, and a cyclohexylmethyl group. Examples of the alkylene group $R^{103}$ include a methylene group, an ethylene group, a propylene group, a butylene group, a pentylene group, a hexylene group, a heptylene group, an octylene group, a nonylene group, a 1,4-cyclohexylene group, a 1,2-cyclohexylene group, a 1,3-cyclopentylene group, a 1,4-cyclooctylene group, and a 1,4-cyclohexanedimethylene group. Examples of the 2-oxoalkyl group $R^{104a}$ and $R^{104b}$ include a 2-oxopropyl group, a 2-oxocyclopentyl group, a 2-oxocyclohexyl group, and a 2-oxocycloheptyl group. Examples of the counter ion K⁻ are the same as exemplified for the formulae (P1a-1), (P1a-2) and (P1a-3).

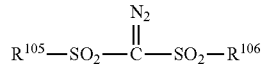
(P2)

wherein $R^{105}$ and $R^{106}$ independently represent a linear, branched, or cyclic alkyl or halogenated alkyl group having 1 to 12 carbon atoms, an aryl or halogenated aryl group having 6 to 20 carbon atoms, or an aralkyl group having 7 to 12 carbon atoms.

As to the groups represented by $R^{105}$ and $R^{106}$, examples of the alkyl group include a methyl group, an ethyl group, a propyl group, an isopropyl group, a n-butyl group, a sec-butyl group, a tert-butyl group, a pentyl group, a hexyl group, a heptyl group, an octyl group, an amyl group, a cyclopentyl group, a cyclohexyl group, a cycloheptyl group, a norbornyl group, and an adamantyl group. Examples of the halogenated alkyl group include a trifluoromethyl group, a 1,1,1-trifluoroethyl group, a 1,1,1-trichloroethyl group, and a nonafluorobutyl group. Examples of the aryl group include a phenyl group; alkoxyphenyl groups such as a p-methoxyphenyl group, a m-methoxyphenyl group, an o-methoxyphenyl group, an ethoxyphenyl group, a p-tert-butoxyphenyl group, and a m-tert-butoxyphenyl group; and alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group. Examples of the halogenated aryl group include a fluorophenyl group, a chlorophenyl group, and a 1,2,3,4,5-pentafluorophenyl group. Examples of the aralkyl group include a benzyl group and a phenethyl group.

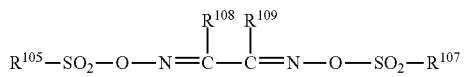
(P3)

wherein $R^{107}$, $R^{108}$, and $R^{109}$ independently represent a linear, branched, or cyclic alkyl or halogenated alkyl group having 1 to 12 carbon atoms, an aryl or halogenated aryl group having 6 to 20 carbon atoms, or an aralkyl group having 7 to 12 carbon atoms; $R^{108}$ and $R^{109}$ may be mutually bonded to form a cyclic structure, and when the cyclic structure is formed, $R^{108}$ and $R^{109}$ each represent a linear or branched alkylene groups having 1 to 6 carbon atoms; $R^{105}$ is as defined above.

Examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene group represented by $R^{108}$ and $R^{109}$ include a methylene group, an ethylene group, a propylene group, a butylene group, and a hexylene group.

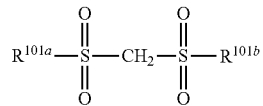
(P4)

wherein $R^{101a}$ and $R^{101b}$ are as defined above.

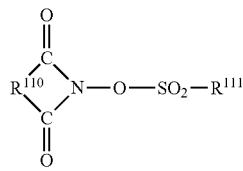
(P5)

wherein $R^{110}$ represents an arylene group having 6 to 10 carbon atoms, an alkylene group having 1 to 6 carbon atoms, or an alkenylene group having 2 to 6 carbon atoms, where a part or all of hydrogen atoms in these groups may be substituted by a linear or branched alkyl or alkoxy group having 1 to 4 carbon atoms, a nitro group, an acetyl group, or a phenyl group; $R^{111}$ represents a linear, branched, or cyclic alkyl, alkenyl, or alkoxyalkyl group having 1 to 8 carbon atoms, a phenyl group, or a naphthyl group, where a part or all of hydrogen atoms in these groups may be substituted by an alkyl or alkoxy group having 1 to 4 carbon atoms, a phenyl group (which may be substituted by an alkyl or alkoxy group having 1 to 4 carbon atoms, a nitro group, or an acetyl group), a hetero-aromatic group having 3 to 5 carbon atoms, a chlorine atom, or a fluorine atom.

As to the group represented by $R^{110}$, examples of the arylene group include a 1,2-phenylene group and a 1,8-naphthylene group; examples of the alkylene group include a methylene group, an ethylene group, a trimethylene group, a tetramethylene group, a phenylethylene group, and a norbornane-2,3-diyl group; examples of the alkenylene group include a 1,2-vinylene group, a 1-phenyl-1,2-vinylene group, and a 5-norbornene-2,3-diyl group. As to the group represented by $R^{111}$, examples of the alkyl group are as exemplified for $R^{101a}$ to $R^{101c}$; examples of the alkenyl group include a vinyl group, a 1-propenyl group, an allyl group, a 1-butenyl group, a 3-butenyl group, an isoprenyl group, a 1-pentenyl group, a 3-pentenyl group, a 4-pentenyl group, a dimethylallyl group, a 1-hexenyl group, a 3-hexenyl group, a 5-hexenyl group, a 1-heptenyl group, a 3-heptenyl group, a 6-heptenyl group, and a 7-octenyl group; examples of the alkoxyalkyl group include a methoxymethyl group, an ethoxymethyl group, a propoxymethyl group, a butoxymethyl group, a pentyloxymethyl group, a hexyloxymethyl group, a heptyloxymethyl group, a methoxyethyl group, an ethoxyethyl group, a propoxyethyl group, a butoxyethyl group, a pentyloxyethyl group, a hexyloxyethyl group, a methoxypropyl group, an ethoxypropyl group, a propoxypropyl group, a butoxypropyl group, a methoxybutyl group, an ethoxybutyl group, a propoxybutyl group, a methoxypentyl group, an ethoxypentyl group, a methoxyhexyl group, and a methoxyheptyl group.

As to the groups used as the substituent, example of the alkyl group having 1 to 4 carbon atoms include a methyl group, an ethyl group, a propyl group, an isopropyl group, a n-butyl group, an isobutyl group, and a tert-butyl group; examples of the alkoxy group having 1 to 4 carbon atoms include a methoxy group, an ethoxy group, a propoxy group, an isopropoxy group, a n-butoxy group, an isobutoxy group, and a tert-butoxy group; examples of the phenyl group which may be substituted by a alkyl or alkoxy having 1 to 4 carbon atoms, a nitro group, or an acetyl group include a phenyl group, a tolyl group, a p-tert-butoxyphenyl group, a p-acetylphenyl group, and a p-nitrophenyl group; examples of the hetero-aromatic group having 3 to 5 carbon atoms include a pyridyl group and a furyl group.

Examples of the onium salt used as the acid generator include tetramethylammonium trifluoromethanesulfonate, tetramethylammonium nonafluorobutanesulfonate, triethylammonium nonafluorobutanesulfonate, pyridinium nonafluorobutanesulfonate, triethylammonium camphorsulfonate, pyridinium camphorsulfonate, tetra-n-butylammonium nonafluorobutanesulfonate, tetraphenylammonium nonafluorobutanesulfonate, tetramethylammonium p-toluenesulfonate, diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, (2-norbornyl) methyl(2-oxocyclohexyl)sulfonium trifluoro-methanesulfonate, ethylenebis[methyl(2-oxocyclopentyl)sulfonium trifluoro-methanesulfonate], 1,2'-naphthalenecarbonylmethyl-tetrahydrothiophenium triflate, triethylammonium nonaflate, tributylammonium nonaflate, tetraethylammonium nonaflate, tetrabutylammonium nonaflate, triethylammonium bis(trifluoromethylsulfonyl)imide, and triethylammonium tris(perfluoroethylsulfonyl)methide.

Examples of the diazomethane derivative used as the acid generator include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane.

Examples of the glyoxime derivative used as the acid generator include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Examples of the bissulfone derivative used as the acid generator include bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane.

Examples of the sulfonate derivative of a N-hydroxyimide compound used as the acid generator include N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutar imide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2, 3-dicarboxyimide trifluoromethanesulfonate, and N-hydroxy-5-norbornene-2,3-dicarboxyimide p-toluenesulfonate.

Examples of the β-ketosulfonic acid derivative used as the acid generator include 2-cyclohexylcarbonyl-2-(p-toluenesulfonyl)propane and 2-isopropylcarbonyl-2-(p-toluenesulfonyl)propane.

Examples of the disulfone derivative used as the acid generator include diphenyl disulfone derivatives and dicyclohexyl disulfone derivatives.

Examples of the nitrobenzylsulfonate derivative used as the acid generator include 2,6-dinitrobenzyl p-toluenesulfonate and 2,4-dinitrobenzyl p-toluenesulfonate.

Examples of the sulfonate derivative used as the acid generator include 1,2,3-tris (methanesulfonyloxy)benzene, 1,2,3-tris (trifluoromethanesulfonyloxy)benzene, and 1,2,3-tris (p-toluenesulfonyloxy)benzene.

Above all, preferable acid generators are onium salts such as triphenylsulfonium trifluoromethanesulfonate, (p-tert-butoxyphenyl)diphenylsulfonium trifluoromethane-sulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl) sulfonium trifluoromethanesulfonate, (2-norbornyl) methyl(2-oxocyclohexyl)sulfonium trifluoromethanesulfonate, and 1,2'-naphthalenecarbonylmethyltetrahydrothiophenium triflate;

diazomethane derivatives such as bis(benzenesulfonyl)diazomethane, bis(p-toluenesulfonyl) diazomethane, bis(cyclohexylsulfonyl)diazomethane, bis(n-butylsulfonyl) diazomethane, bis(isobutylsulfonyl)diazomethane, bis(sec-butylsulfonyl) diazomethane, bis(n-propylsulfonyl) diazomethane, bis(isopropylsulfonyl)diazomethane, and bis (tert-butylsulfonyl) diazomethane; glyoxime derivatives such as bis-O-(p-toluenesulfonyl)-α-dimethylglyoxime and bis-O-(n-butanesulfonyl) -α-dimethylglyoxime; bissulfone derivatives such as bisnaphthylsulfonylmethane; and sulfonate derivatives of a N-hydroxyimide compound such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These acid generators may be used alone or in combination of two or more kinds thereof. The amount of the acid generator to be added is preferably 0.05 to 50 parts by mass, more preferably 0.1 to 10 parts by mass, based on 100 parts by mass of the base resin. When the amount is 0.05 part by mass or more, there is no fear that crosslinking reaction is insufficiently induced due to lack of acid. When the amount is 50 parts by mass or less, there is no fear of mixing phenomenon due to the migration of an acid into an overlying film.

[(D) Surfactant]

To the inventive resist under layer film composition, (D) a surfactant may be added to improve coating property by spin coating. Examples of the usable surfactant are disclosed in paragraphs (0142) to (0147) of Japanese Patent Laid-Open Publication No. 2009-269953.

[(E) Crosslinking Agent]

To the inventive resist under layer film composition, (E) a crosslinking agent may be added to enhance curability and further inhibit intermixing with an overlying film. The crosslinking agent is not particularly limited, and various known crosslinking agents can be widely used. Examples thereof include melamine, glycoluril, benzoguanamine, urea, β-hydroxyalkylamide, isocyanurate, aziridine, oxazoline, and epoxy crosslinking agents.

Illustrative examples of the melamine crosslinking agent include hexamethoxymethylated melamine, hexabutoxymethylated melamine, alkoxy- and/or hydroxy-substituted derivatives thereof, and partial self-condensates thereof. Illustrative examples of the glycoluril crosslinking agent include tetramethoxymethylated glycoluril, tetrabutoxymethylated glycoluril, alkoxy- and/or hydroxy-substituted derivatives thereof, and partial self-condensates thereof. Illustrative examples of the benzoguanamine crosslinking agent include tetramethoxymethylated benzoguanamine, tetrabutoxymethylated benzoguanamine, alkoxy- and/or hydroxy-substituted derivatives thereof, and partial self-condensates thereof. Illustrative examples of the urea crosslinking agent include dimethoxymethylated dimethoxyethyleneurea, alkoxy- and/or hydroxy-substituted derivatives thereof, and partial self-condensates thereof. Illustrative examples of the β-hydroxyalkylamide crosslinking agent include N,N,N',N'-tetra(2-hydroxyethyl) adipic acid amide. Illustrative examples of the isocyanurate crosslinking agent include triglycidyl isocyanurate and triallyl isocyanurate. Illustrative examples of the aziridine crosslinking agent include 4,4'-bis(ethyleneiminocarbonylamino)diphenylmethane and 2,2-bishydroxymethylbutanol -tris[3-(1-aziridinyl)propionate]. Illustrative examples of the oxazoline crosslinking agent include 2,2'-isopropylidene bis(4-benzyl-2-oxazoline), 2,2'-isopropylidene bis(4-phenyl-2-oxazoline), 2,2'-methylene bis(4,5-diphenyl-2-oxazoline), 2,2'-methylene bis(4-phenyl-2-oxazoline), 2,2'-methylene bis(4-tert-butyl -2-oxazoline), 2,2'-bis(2-oxazoline), 1,3-phenylene bis(2-oxazoline), 1,4-phenylene bis(2-oxazoline), a 2-isopropenyloxazoline copolymer. Illustrative examples of the epoxy crosslinking agent include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, pentaerythritol tetraglycidyl ether.

[(F) Plasticizer]

To the inventive resist under layer film composition, (F) a plasticizer may be added to further improve the filling and planarizing properties. The plasticizer is not particularly limited, and various known plasticizers can be widely used. Examples thereof include low molecular weight compounds such as phthalate esters, adipate esters, phosphorate esters, trimellitate esters, and citrate esters; polymers such as polyethers, polyesters, and polyacetal polymers disclosed in Japanese Patent Laid-Open Publication No. 2013-253227.

[(G) Colorant]

To the inventive resist under layer film composition, (G) a colorant may be added to further improve the resolution of patterning in the multilayer lithography. The colorant is not particularly limited so long as it is a compound having appropriate absorption at a exposure wavelength; and various known colorants can be widely used. Examples thereof include benzene compounds, naphthalene compounds, anthracene compounds, phenanthrene compounds, pyrene compounds, isocyanuric acid compounds, and triazine compounds.

The inventive resist under layer film composition as described above has good alkali aqueous hydrogen peroxide resistance, excellent filling and planarizing properties, and excellent dry etching property since the inventive polymer for a resist under layer film composition is contained therein as the base resin. Moreover, addition of various additives into the resist under layer film composition allows fine adjustment of the coating and film-forming property by spin coating, curing temperature, filling and planarizing properties, optical characteristics (light absorption characteristics) and so on, thereby enabling the composition to have a desired characteristics.

The alkali aqueous hydrogen peroxide resistance of the resist under layer film formed from the inventive resist under layer film composition will now be explained. In recent years, as mentioned above, some cases require the step of removing a resist middle layer film by wet etching with an alkali aqueous hydrogen peroxide such as SC1 or the step of processing a substrate by wet etching with an alkali aqueous hydrogen peroxide such as SC1. In these cases, the resistance to a wet etching liquid such as SC1 is needed in the resist under layer film.

Thus, the inventive resist under layer film composition is preferably capable of forming a resist under layer film that is not peeled when the resist under layer film is formed on a silicon substrate and the silicon substrate is immersed in a 1.0 mass % aqueous hydrogen peroxide containing 0.5 mass % ammonia at 23° C. for 10 minutes. Further, the resist under layer film composition is preferably capable of forming a resist under layer film that is not peeled when the resist under layer film is formed on a silicon substrate and the silicon substrate is immersed in a 1.0 mass % aqueous hydrogen peroxide containing 0.5 mass % ammonia at 65° C. for 5 minutes.

Such a resist under layer film composition has sufficient alkali aqueous hydrogen peroxide resistance to perform wet etching under various conditions. In other words, such a composition increases alternatives of the processable substrate to be processed and the removable resist middle layer film.

Exemplary method of examining the alkali aqueous hydrogen peroxide resistance of the resist under layer film are as follows. For example, onto a silicon wafer having a diameter of 4 inches (100 mm), the resist under layer film composition is applied to form a film with a thickness of about 200 nm, in accordance with the film-forming conditions described later. The wafer is then cut into pieces having a width of 2 cm. The wafer piece is immersed in a 1.0 mass % aqueous hydrogen peroxide containing 0.5 mass % ammonia at 23° C. for 10 minutes or at 65° C. for 5 minutes. Thereafter, the wafer piece is rinsed with deionized water to visually examine whether the resist under layer film is peeled from the wafer. If a part or whole of the resist under layer film is peeled and the surface of the silicon wafer is exposed, the resist under layer film subjected to the inspection is judged to have inadequate alkali aqueous hydrogen peroxide resistance.

<Patterning Process>

In the present invention, a fine pattern can be formed by using the inventive resist under layer film composition by the multilayer resist method (e.g., 2-layer resist process, 3-layer resist process, or 4-layer resist process).

[2-Layer Resist Process]

The present invention provides a patterning process for forming a pattern in a substrate to be processed, the process including the steps of:

(I-1) forming a resist under layer film on the substrate to be processed by using the above resist under layer film composition;
(I-2) forming a resist upper layer film on the resist under layer film by using a photoresist composition;
(I-3) subjecting the resist upper layer film to pattern exposure and development with a developer to form a pattern in the resist upper layer film; and
(I-4) transferring the pattern to the resist under layer film by dry etching using the resist upper layer film having the formed pattern as a mask.

(Step (I-1))

In the inventive patterning process by 2-layer resist process, first, a resist under layer film is formed on a substrate to be processed by using the inventive resist under layer film composition (step (I-1)). The substrate to be processed may be, but is not limited to, a substrate on which a layer to be processed is formed. The substrate is not particularly limited, and a material such as Si, α-Si, p-Si, $SiO_2$, SiN, SiON, W, TiN, and Al, and a different material from the layer to be processed is preferably used. The layer to be processed is preferably made of Si, $SiO_2$, SiON, SiN, p-Si, α-Si, W, TiN, W-Si, Al, Cu, Al—Si, or the like; various low dielectric constant (low-k) films, or etching stopper film thereof. The layer is preferably formed with a thickness of 50 to 10,000 nm, particularly 100 to 5,000 nm.

It is also preferable to use a substrate having a structure or a step with a height of 30 nm or more, as the substrate to be processed. As mentioned above, since the resist under layer film formed from the inventive resist under layer film composition has excellent filling and planarizing properties, the resist under layer film can be formed without voids even on a substrate having a structure or a step with a height of 30 nm or more.

The resist under layer film can be formed by applying the inventive resist under layer film composition on the substrate to be processed by spin coating or the like, and then performing heat treatment (baking) for evaporating the solvent, preventing from mixing with the overlying film, and promoting the crosslinking reaction. When the composition is applied by spin coating or the like, good filling property can be obtained.

The heat treatment temperature is preferably 100° C. to 300° C., more preferably 150° C. to 280° C. The heat treatment time is preferably 10 to 600 seconds, more preferably 10 to 300 seconds. The heat treatment temperature of 100° C. or higher is sufficient to cure the composition, and thus enables the prevention of mixing with an overlying film more certainly. Also, when the heat treatment temperature is 300° C. or lower, there is no risk of the reduction in film thickness and the non-uniformity of the film surface due to thermal decomposition of the base resin, so that a flat resist under layer film can be formed without voids even on a substrate having unevenness. Moreover, by appropriately adjusting the heat treatment temperature and the heat treatment time within the above ranges, proper filling and planarizing properties and thermosetting property can be obtained according to the use.

The thickness of the under layer film is appropriately selected, and it is preferred to set 30 to 20,000 nm, more preferably 50 to 15,000 nm.

(Step (I-2))

In the inventive patterning process by 2-layer resist process, secondly, a resist upper layer film is formed on the resist under layer film by using a photoresist composition (step (1-2)). The resist upper layer film can be formed from a photoresist composition generally used. The resist upper layer film may or may not contain silicon, and may be either of positive or negative resist.

The resist upper layer film can be formed, for example, by applying the photoresist composition on the resist under layer film by spin coating or the like, and then performing heat treatment (pre-baking), like the formation of the resist under layer film. Pre-baking is preferably performed at 60 to 180° C. for 10 to 300 seconds. The thickness of the resist upper layer film is not particularly limited, and is preferably 30 to 500 nm, particularly 50 to 400 nm.

(Step (I-3))

In the inventive patterning process by 2-layer resist process, then, the resist upper layer film is subjected to pattern exposure and development with a developer to form a pattern in the resist upper layer film (step (I-3)). The exposure light may be appropriately selected according to the used photoresist composition, etc. For example, a high energy beam having a wavelength of 300 nm or less can be used. More specifically, there may be mentioned excimer laser having a wavelength of 248 nm, 193 nm or 157 nm, soft X-ray having a wavelength of 3 to 20 nm, electron beam, X-ray, etc. After exposure, post exposure baking (PEB) may be performed in the conventional manner. The developer may be appropriately selected according to the used photoresist composition, etc. Both of positive development and negative development are possible.

(Step (I-4))

In the inventive patterning process by 2-layer resist process, then, the pattern is transferred to the resist under layer film by dry etching using the resist upper layer film having the formed pattern as a mask (step (I-4)). Dry etching conditions may be appropriately selected according to the used photoresist composition, etc.

[3-Layer Resist Process]

The present invention provides a patterning process for forming a pattern in a substrate to be processed, the process including the steps of:

(II-1) forming a resist under layer film on the substrate to be processed by using the above resist under layer film composition;

(II-2) forming a resist middle layer film on the resist under layer film;

(II-3) forming a resist upper layer film on the resist middle layer film by using a photoresist composition;

(II-4) subjecting the resist upper layer film to pattern exposure and development with a developer to form a pattern in the resist upper layer film;

(II-5) transferring the pattern to the resist middle layer film by dry etching using the resist upper layer film having the formed pattern as a mask; and (II-6) transferring the pattern to the resist under layer film by dry etching using the resist middle layer film having the transferred pattern as a mask.

(Step (II-1))

The step (II-1) in the inventive patterning process by 3-layer resist process may be performed in the same manner as the step (I-1) in the patterning process by 2-layer resist process mentioned above.

(Step (II-2))

In the inventive patterning process by 3-layer resist process, secondly, a resist middle layer film is formed on the resist under layer film (step (II-2)). The resist middle layer film preferably has a different etching resistance from the resist under layer film. More specifically, a silicon-containing resist middle layer film is preferable.

Examples of the silicon-containing resist middle layer film include an inorganic hard mask intermediate film such as a silicon oxide film, a silicon nitride film, and a silicon oxynitride film (SiON film). Such an inorganic hard mask intermediate film can be formed by the CVD method or the ALD method. As examples of the method of forming a silicon oxynitride film, there may be mentioned methods disclosed in Japanese Patent Laid-Open Publication No. 2002-334869 and International Publication No. WO2004/066377. The thickness of the inorganic hard mask intermediate film is preferably 5 to 200 nm, more preferably 10 to 100 nm. Among them, a SiON film, which has a high function as the anti-reflective film, is most preferably used.

As the silicon-containing resist middle layer film, a polysilsesquioxane-based middle layer film is also preferably used. The polysilsesquioxane-based middle layer film is easily provided with an anti-reflective effect, whereby a reflective light can be advantageously suppressed in pattern exposure of the resist upper layer film, and thus the resolution can be improved. In particular, when a composition containing many aromatic groups is used as a resist under layer film for 193-nm exposure, a k value and thus a substrate reflection are rather increased. Nonetheless, the reflection is restricted by the resist middle layer film, thereby enabling the substrate reflection to decrease to 0.5% or less. Preferably used as the resist middle layer film having an anti-reflective effect is a polysilsesquioxane, which has a pendant anthracene for exposure of 248 nm or 157 nm, or a pendant phenyl group or a pendant light-absorbing group having a silicon-silicon bond for 193 nm exposure, and which is crosslinked by an acid or a heat. The silicon-containing resist middle layer film that can be formed by spin coating also has a merit that the film is easily formed with lower cost than the inorganic hard mask intermediate film formed by the CVD method, etc.

(Step (II-3))

The step (II-3) in the inventive patterning process by 3-layer resist process may be performed in the same manner as the step (I-2) in the patterning process by 2-layer resist process mentioned above, except that the resist upper layer film is formed on the resist middle layer film not the resist under layer film. When a silicon-containing resist middle layer film is formed as the resist middle layer film as mentioned above, it is preferable to form a resist upper layer film having a different etching resistance from the silicon-containing resist middle layer film, more specifically, it is preferable to form a resist upper layer film not containing silicon.

(Step (II-4))

The step (II-4) in the inventive patterning process by 3-layer resist process may be performed in the same manner as the step (I-3) in the patterning process by 2-layer resist process mentioned above.

(Step (II-5))

In the inventive patterning process by 3-layer resist process, then, the pattern is transferred to the resist middle layer film by dry etching using the resist upper layer film having the formed pattern as a mask (step (II-5)). The dry etching in this step is preferably performed with a fluorocarbon-based gas.

(Step (II-6))

In the inventive patterning process by 3-layer resist process, then, the pattern is transferred to the resist under layer film by dry etching using the resist middle layer film having the transferred pattern as a mask (step (II-6)). Since the silicon-containing resist middle layer film has resistance to a dry etching with an oxygen gas or a hydrogen gas, the etching in this step is preferably performed with an etching gas mainly consisting of an oxygen gas or a hydrogen gas.

[4-Layer Resist Process]

The present invention provides a patterning process, for forming a pattern in a substrate to be processed, the process including the steps of:

(III-1) forming a resist under layer film on the substrate to be processed by using the above resist under layer film composition;

(III-2) forming an inorganic hard mask intermediate film selected from a silicon oxide film, a silicon nitride film, and silicon oxynitride film on the resist under layer film;

(III-3) forming an organic anti-reflective film on the inorganic hard mask intermediate film;

(III-4) forming a resist upper layer film on the organic anti-reflective film by using a photoresist composition;

(III-5) subjecting the resist upper layer film to pattern exposure and development with a developer to form a pattern in the resist upper layer film;

(III-6) transferring the pattern to the organic anti-reflective film and the inorganic hard mask intermediate film by dry etching using the resist upper layer film having the formed pattern as a mask; and (III-7) transferring the pattern to the resist under layer film by dry etching using the inorganic hard mask intermediate film having the transferred pattern as a mask.

(Step (III-1))

The step (III-1) in the inventive patterning process by 4-layer resist process may be performed in the same manner as the step (I-1) in the patterning process by 2-layer resist process mentioned above.

(Step (III-2))

The step (III-2) in the inventive patterning process by 4-layer resist process may be performed in the same manner as the forming of the inorganic hard mask intermediate film in the step (II-2) in the patterning process by 3-layer resist process mentioned above.

(Step (III-3))

In the inventive patterning process by 4-layer resist process, then, an organic anti-reflective film (BARC) is formed on the inorganic hard mask intermediate film (step (III-3)). When a SiON film is used as the inorganic hard mask intermediate film, it is possible to suppress reflection by virtue of the two-layer anti-reflective films of the SiON film and the BARC film, even in a liquid immersion exposure at a high NA exceeding 1.0. Another merit of the BARC formation is to reduce footing of a photoresist pattern compared to a photoresist pattern just above the SiON film. As the BARC, there is no particular limitation, and any known materials can be used.

(Step (III-4))

The step (III-4) in the inventive patterning process by 4-layer resist process may be performed in the same manner as the step (I-2) in the patterning process by 2-layer resist process mentioned above, except that the resist upper layer film is formed on the organic anti-reflective film not the resist under layer film.

(Step (III-5))

The step (III-5) in the inventive patterning process by 4-layer resist process may be performed in the same manner as the step (I-3) in the patterning process by 2-layer resist process mentioned above.

(Step (III-6))

The step (III-6) in the inventive patterning process by 4-layer resist process may be performed in the same manner as the step (II-5) in the patterning process by 3-layer resist process mentioned above. Etching of the BARC may be continuously conducted prior to etching of the inorganic hard mask intermediate film, or etching of the BARC alone may be conducted and then etching of the inorganic hard mask intermediate film may be conducted after changing an etching apparatus.

(Step (III-7))

The step (III-7) in the inventive patterning process by 4-layer resist process may be performed in the same manner as the step (II-6) in the patterning process by 2-layer resist process mentioned above.

In addition, in the inventive patterning processes by 2-layer, 3-layer, or 4-layer resist process, after the step (I-4), (II-6), or (III-7), the pattern may be transferred to the substrate to be processed by dry etching using the resist under layer film having the transferred pattern as a mask. This dry etching may be carried out in the conventional manner. For example, when the layer to be processed of the substrate to be processed is made of SiO2, SiN, or silica-based low dielectric constant insulating film, the substrate can be processed by dry etching with a fluorocarbon-based gas. Meanwhile, when the layer to be processed is made of p-Si, Al, or W, the substrate can be processed by dry etching with a chlorine-based or bromine-based gas. When the substrate is processed by dry etching with a fluorocarbon-based gas, the resist middle layer of the 3-layer process is peeled (removed) simultaneously with the substrate processing. On the other hand, when the substrate is processed by dry etching with a chlorine-based gas or a bromine-based gas, the resist middle layer film is not peeled by the dry etching. In the conventional manner, therefore, the resist middle layer film is required to be separately peeled by, for example, dry etching with a fluorocarbon-based gas after the substrate processing.

By contrast, the inventive patterning process has an alternative of peeling the resist middle layer film alone by wet etching with an alkali aqueous hydrogen peroxide since the resist under layer film formed from the inventive resist under layer film composition has good alkali aqueous hydrogen peroxide resistance as mentioned above. That is, the inventive patterning process by 3-layer resist process may further include, after the step (II-6), the step of removing the resist middle layer film having the transferred pattern by wet etching with an alkali aqueous hydrogen peroxide.

Moreover, when the substrate to be processed is made of W or TiN, the inventive patterning process may provide an alternative of processing the substrate to be processed by wet etching with an alkali aqueous hydrogen peroxide. That is, the inventive patterning processes by 2-layer, 3-layer resist, 4-layer process may further include, after the step (I-4), (II-6), or (III-7), the step of transferring the pattern to the substrate to be processed by wet etching with an alkali aqueous hydrogen peroxide using the resist under layer film having the transferred pattern as a mask.

In addition, the inventive patterning processes by 2-layer, 3-layer, or 4-layer resist process may further include, after the step (I-4), (II-6), or (III-7), the step of implanting an ion by using the resist under layer film having the transferred pattern as a mask to form the pattern in the substrate to be processed.

Removal of the resist middle layer film after the ion implantation may be performed by dry etching or wet etching, similarly to the above-mentioned removal of the resist middle layer film after processing the substrate. That is, the inventive patterning process by 3-layer resist process may further include, after the step of implanting the ion to form the pattern in the substrate to be processed, the step of removing the resist middle layer film having the transferred pattern by wet etching with an alkali aqueous hydrogen peroxide.

The resist under layer film used as a mask may be removed by dry etching. At this time, the dry etching rate of the resist under layer film used as a mask is preferably higher than that of the resist upper layer film (i.e., it is preferable to use a resist under layer film composition that exhibits a higher dry etching rate than that of the resist upper layer film), since a portion that is generally difficult to be removed, such as a corner of substrate steps, can be completely removed by dry etching to manufacture a semiconductor apparatus having few defects.

In the present invention, the composition of the alkali aqueous hydrogen peroxide used in wet etching is not particularly limited. For example, a mixture of deionized water, hydrogen peroxide, and ammonia may be preferably used. In this case, the concentration of hydrogen peroxide is preferably 0.1 to 10 mass %, more preferably 0.2 to 5 mass %. The concentration of ammonia is preferably 0.1 to 10 mass %, more preferably 0.2 to 5 mass %. Particularly preferable is a mixing liquid consisting of 5 parts by mass of deionized water, 1 part by mass of a 29 mass % aqueous ammonia, and 1 part by mass of a 30 mass % aqueous hydrogen peroxide, called Standard Clean-1 (SC1). The SC1 is generally used for washing a semiconductor wafer, and a standard chemical solution for removing organic impurities and microparticles on wafer surface. The treatment temperature for wet etching is preferably 0 to 90° C., more preferably 20 to 80° C.

FIG. 1(A) to (F) shows an example of the inventive patterning process by 3-layer resist process.

In the case of the 3-layer resist process, as shown in FIG. 1(A), after a resist under layer film 3 is formed on a layer to be processed 2 on a substrate 1, a resist middle layer film 4 is formed thereon, and a resist upper layer film 5 is formed thereon. Then, as shown in FIG. 1(B), an exposure portion 6 of the resist upper layer film 5 is exposed to a light, followed by post exposure baking (PEB). Then, as shown in FIG. 1(C), a resist upper layer film pattern 5a is formed by development. Then, as shown in FIG. 1(D), the resist middle layer film 4 is processed by dry etching with a fluorocarbon-based gas, using the resist upper layer film pattern 5a as a mask to form a resist middle layer film pattern 4a. Subsequently, as shown in FIG. 1(E), after the resist upper layer film pattern 5a is removed, the resist under layer film 3 is processed by plasma etching with an oxygen-based gas or a hydrogen-based gas, using the resist middle layer film pattern 4a as a mask to form a resist under layer film pattern 3a. Further, as shown in FIG. 1(F), after the resist middle layer film pattern 4a is removed, the layer to be processed 2 is processed by etching using the resist under layer film pattern 3a as a mask to form a pattern 2a. The etching processing of the layer to be processed 2 may be conducted by dry etching or wet etching with an alkali aqueous hydrogen peroxide such as SC1.

As mentioned above, the inventive patterning process enables the formation of a fine pattern by the multilayer resist method (e.g., 2-layer resist process, 3-layer resist process, or 4-layer resist process). Moreover, since the resist under layer film formed from the inventive resist under layer film composition has excellent filling and planarizing properties, a flat resist under layer film can be formed without voids even on a substrate having unevenness. Moreover, since the resist under layer film formed from the inventive resist under layer film composition has good alkali aqueous hydrogen peroxide resistance, the removal of the resist middle layer film and the pattern transfer to the substrate to be processed can be performed by wet etching process with an alkali aqueous hydrogen peroxide. Moreover, since the resist under layer film formed from the inventive resist under layer film composition has excellent dry etching property, the resist under layer film used as a mask can be completely removed by dry etching. Consequently, a semiconductor apparatus with few defects can be manufactured.

EXAMPLES

In the following, the present invention is specifically explained by referring to synthesis examples, examples, and comparative examples, but the present invention is not limited thereto.

As for the molecular weight and the dispersibility, a weight average molecular weight (Mw) and a number average molecular weight (Mn) were measured by gel permeation chromatography (GPC) using tetrahydrofuran as an eluent in terms of polystyrene, and a dispersibility (Mw/Mn) is calculated therefrom. The glass transition temperature (Tg) was measured by differential scanning calorimetry (DSC).

Synthesis Example 1

Synthesis of Polymer (A1)

38.9 g of propylene glycol monomethyl ether acetate (shown as "PGMEA" below) was stirred under heating at 100° C. in nitrogen atmosphere. A mixture containing 29.7 g of glycidyl methacrylate, 11.3 g of benzyl acrylate, 8.9 g of tert-butyl acrylate, and 38.9 g of PGMEA and a mixture containing 4.0 g of dimethyl 2,2-azobis(2-methylpropionate) and 38.9 g of PGMEA were simultaneously and separately added thereto over 2 hours. The resulting mixture was further stirred for 2 hours, and then cooled to room temperature to obtain a desired PGMEA solution of polymer (A1). The polymer (A1) was analyzed, consequently finding a weight average molecular weight (Mw) of 4,500, a dispersibility (Mw/Mn) of 1.95, and a glass transition temperature (Tg) of 44° C.

Synthesis Example 2

Synthesis of Polymer (A2)

38.9 g of PGMEA was stirred under heating at 100° C. in nitrogen atmosphere. A mixture containing 29.7 g of glycidyl methacrylate, 11.3 g of benzyl acrylate, 8.9 g of tert-butyl acrylate, and 38.9 g of PGMEA and a mixture containing 4.0 g of dimethyl 2,2-azobis(2-methylpropionate) and 38.9 g of PGMEA were simultaneously and separately added thereto over 2 hours. The resulting mixture was further stirred for 2 hours, and then cooled to 60° C. To the mixture was added 200 g of heptane, and the mixture was cooled to room temperature, and allowed to stand for 2 hours. The upper layer was separated and removed, 100 g of PGMEA was added to the remainder, and the heptane was distilled off under reduced pressure to obtain a desired PGMEA solution of polymer (A2). The polymer (A2) was analyzed, consequently finding a weight average molecular weight (Mw) of 5,000, a dispersibility (Mw/Mn) of 1.75, and a glass transition temperature (Tg) of 47° C.

Synthesis Examples 3 to 6

Synthesis of Polymers (A3) to (A6)

PGMEA solutions of polymers (A3) to (A6) were obtained in the same manner as in synthesis example 2 except that the kind and mole ratio of raw material monomers to be used were changed according to the structure of the target polymer. The weight average molecular weight (Mw), dispersibility (Mw/Mn), and glass transition temperature (Tg) of polymers (A3) to (A6) were as shown in the following.

The polymers (A1) to (A6) synthesized in synthesis examples are shown below.

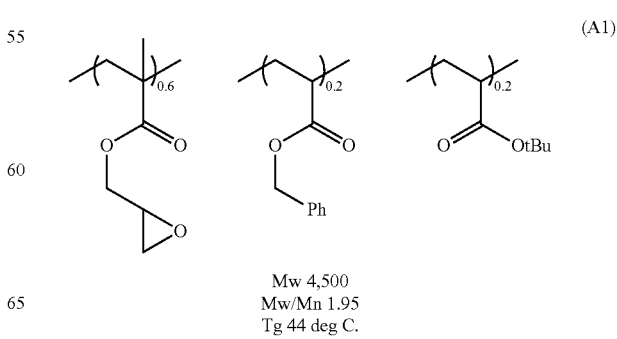

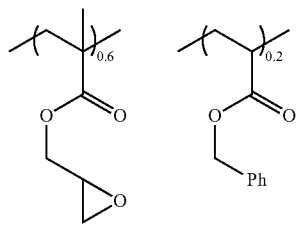

Mw 5,000
Mw/Mn 1.75
Tg 47 deg C.

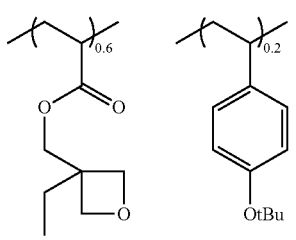

Mw 5,100
Mw/Mn 1.65
Tg 23 deg C.

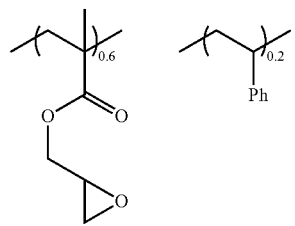

Mw 4,900
Mw/Mn 1.75
Tg 40 deg C.

(A2)

(A3)

(A4)

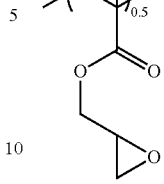

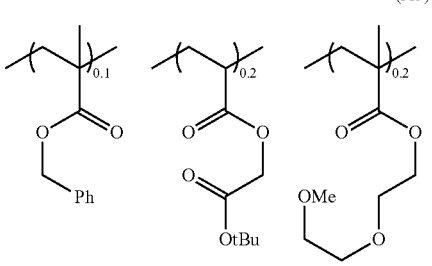

Mw 6,800
Mw/Mn 1.70
Tg 24 deg C.

(A5)

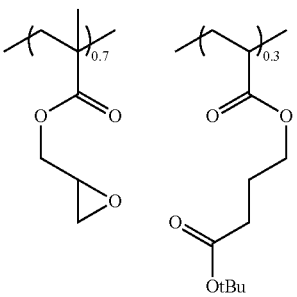

Mw 6,100
Mw/Mn 1.75
Tg 13 deg C.

(A6)

Preparation of Resist Under Layer Film Composition (UL-1 to 7, Comparative UL-1 to 4)

Each polymer (A1) to (A10), an acid generator (C1), a crosslinking agent (E1), a plasticizer (F1), and a colorant (G1) were dissolved in a solvent containing 0.05 mass % FC-4430 (available from Sumitomo 3M Ltd.) with the proportion shown in Table 1, and filtered through a 0.1 μm filter made of a fluorine resin to prepare resist under layer film compositions (UL-1 to 7 and comparative UL-1 to 4).

TABLE 1

| Resist under layer film composition | Polymer (parts by mass) | Acid generator (parts by mass) | Crosslinking agent (parts by mass) | Plasticizer (parts by mass) | Colorant (parts by mass) | Solvent (parts by mass) |
|---|---|---|---|---|---|---|
| UL-1 | A1 (100) | C1 (1) | — | — | — | PGMEA (240) PGME (560) |
| UL-2 | A2 (100) | C1 (1) | — | — | — | PGMEA (240) PGME (560) |
| UL-3 | A3 (100) | C1 (1) | — | — | — | PGMEA (800) |
| UL-4 | A4 (100) | C1 (1) | — | — | — | PGMEA (800) |
| UL-5 | A5 (100) | C1 (1) | — | — | — | PGMEA (800) |
| UL-6 | A6 (100) | C1 (1) | — | — | G1 (10) | PGMEA (800) |
| UL-7 | A4 (100) | C1 (2) | E1 (5) | F1 (2) | G1 (10) | PGMEA (800) |
| Comparative UL-1 | A7 (100) | C1 (2) | E1 (5) | — | — | PGMEA (240) PGME (560) |
| Comparative UL-2 | A8 (100) | C1 (2) | E1 (10) | — | — | PGMEA (800) |
| Comparative UL-3 | A9 (100) | — | — | — | — | PGMEA (800) |
| Comparative UL-4 | A10 (100) | C1 (1) | — | — | — | PGMEA (800) |

PGMEA: propylene glycol monomethyl ether acetate
PGME: propylene glycol monomethyl ether The polymers (A7) to (A10), the acid generator (C1), the crosslinking agent (E1), the plasticizer (F1), and the colorant (G1) are shown below.

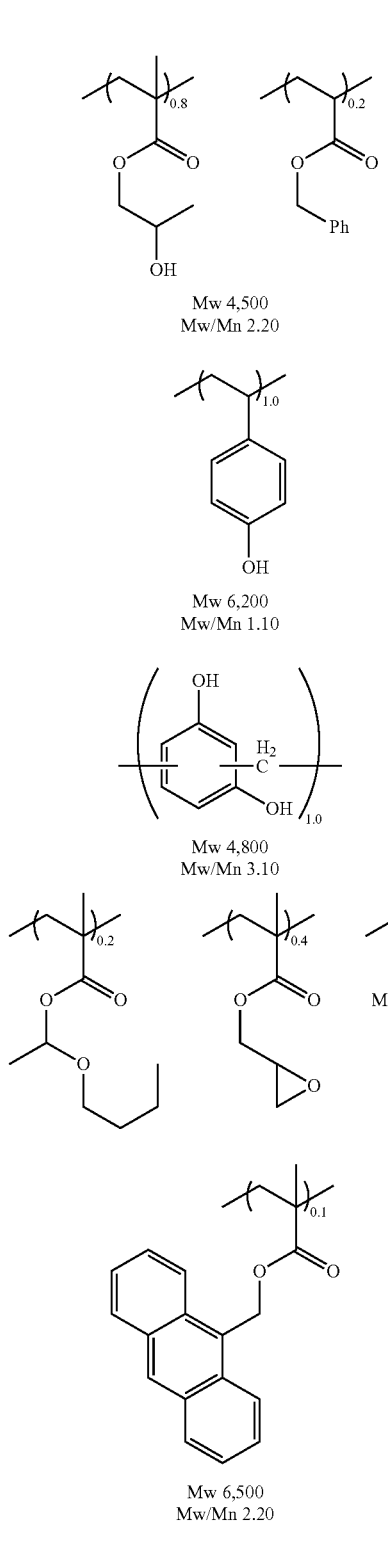

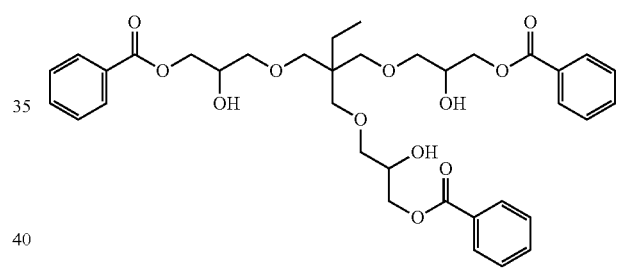

Solvent Resistance and Optical Constant Measurement (Examples 1-1 to 1-7, Comparative Examples 1-1 to 1-4)

The prepared resist under layer film compositions (UL-1 to 7, Comparative UL-1 to 4) were each applied onto a silicon substrate and baked for 60 seconds at a temperature shown in Table 2. The film thickness was then measured. A PGMEA solvent was dispensed thereon, allowed to stand for 30 seconds, and spin dried. The substrate was baked at 100° C. for 60 seconds to evaporate the PGMEA (solvent), and the film thickness was measured again to calculate the difference between thicknesses before and after PGMEA treatment (solvent treatment), thereby evaluating the solvent resistance. Moreover, the optical constants (refractive index n and extinction coefficient k) of the resist under layer film at a wavelength of 193 nm were measured by a spectroscopic ellipsometer with a variable incident light angle (VASE, manufactured by J. A. Woollam Co., Inc.). The results are shown in Table 2.

TABLE 2

| | Resist under layer film composition | Film thickness after film formation: a (Å) | Film thickness after solvent treatment: b (Å) | b/a × 100 (%) | Baking temperature | n/k |
|---|---|---|---|---|---|---|
| Example 1-1 | UL-1 | 2056 | 2056 | 100 | 220° C. | 1.74/0.26 |
| Example 1-2 | UL-2 | 2048 | 2045 | 100 | 220° C. | 1.74/0.26 |
| Example 1-3 | UL-3 | 2036 | 2032 | 100 | 250° C. | 1.66/0.24 |
| Example 1-4 | UL-4 | 2015 | 2013 | 100 | 220° C. | 1.73/0.29 |
| Example 1-5 | UL-5 | 2026 | 2026 | 100 | 250° C. | 1.74/0.13 |
| Example 1-6 | UL-6 | 2010 | 2007 | 100 | 250° C. | 1.60/0.20 |
| Example 1-7 | UL-7 | 2032 | 2030 | 100 | 220° C. | 1.70/0.35 |
| Comparative example 1-1 | Comparative UL-1 | 2026 | 2024 | 100 | 220° C. | 1.74/0.26 |
| Comparative example 1-2 | Comparative UL-2 | 2026 | 2020 | 100 | 250° C. | 1.72/0.81 |
| Comparative example 1-3 | Comparative UL-3 | 2048 | 2040 | 100 | 250° C. | 1.35/0.79 |
| Comparative example 1-4 | Comparative UL-4 | 2035 | 1974 | 97 | 220° C. | 1.68/0.13 |

As shown in Table 2, it could be understood that all of the inventive resist under layer film compositions (UL-1 to 7) had good film-forming property and the films were hardly reduced by the solvent treatment. Thus, these composition are capable of forming a film having solvent resistance. As to the optical constant, the resist under layer film having a n-value of about 1.5 to 1.9 and a k-value of about 0.1 to 0.5 could significantly inhibit reflective light from the substrate though also depending on the film thickness, the kind of the upper layer film, etc., and thus, these films are suitable as an under layer film for a photoresist patterning. In all of the examples, the optical constants were within the preferable ranges, so that it could be understood that these resist under layer film were suitable for photoresist patterning.

A resist upper layer film composition (photoresist for ArF: PR-1) used in patterning was prepared by dissolving a polymer shown by ArF monolayer resist polymer 1, an acid generator PAG1, a base compound amine 1 into a solvent containing 0.1 mass % FC-4430 (available from Sumitomo 3M Ltd.) with the proportion shown in Table 3, and filtering the solution through a 0.1 μm filter made of a fluorine resin.

TABLE 3

| Resist upper layer film composition | Polymer (parts by mass) | Acid generator (parts by mass) | Base compound (part by mass) | Solvent (parts by mass) |
|---|---|---|---|---|
| PR-1 | ArF monolayer resist polymer 1 (100) | PAG1 (6.6) | amine 1 (0.8) | PGMEA (2,500) |

ArF monolayer resist polymer 1, PAG1, and amine 1 are shown below.

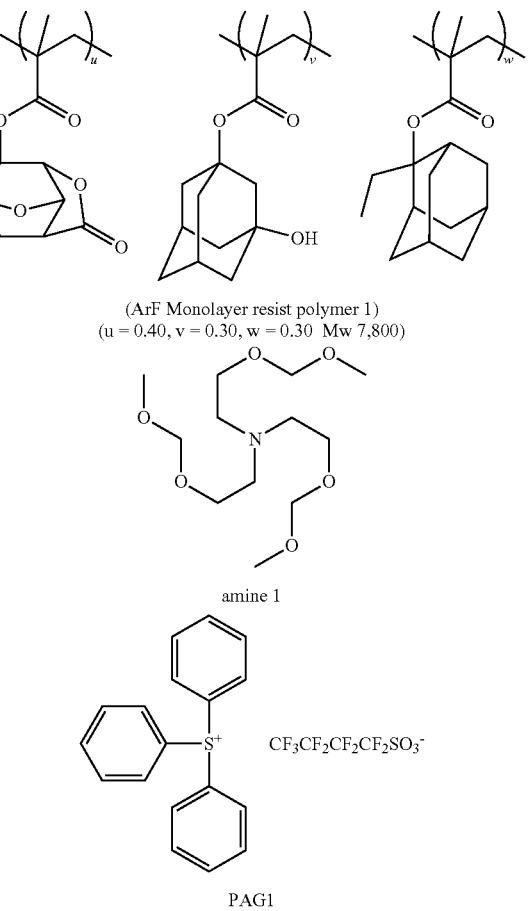

(ArF Monolayer resist polymer 1)
(u = 0.40, v = 0.30, w = 0.30  Mw 7,800)

amine 1

PAG1

The resist upper layer film composition (PR-1) prepared above was applied onto a silicon substrate, and baked at 105° C. for 60 seconds to form a resist upper layer film having a thickness of about 100 nm.

Dry Etching Test with $N_2/H_2$ Gas (Examples 2-1 to 2-7, Comparative Examples 2-1 to 2-5)

The resist under layer films formed on the silicon substrates from the resist under layer film composition (UL-1 to 7, comparative UL-1 to 4) and the resist upper layer film formed on the silicon substrate from the resist upper layer film composition (PR-1) were subjected to dry etching test with $N_2/H_2$ gas under the following etching conditions.

(Etching Condition)

| | |
|---|---|
| Chamber pressure | 2.7 Pa |
| RF power | 1,000 W |
| $N_2$ gas flow rate | 500 mL/min |
| $H_2$ gas flow rate | 30 mL/min |
| Time | 20 sec |

The difference between the film thicknesses before and after dry etching was measured with an etching apparatus TE-8500 manufactured by Tokyo Electron Ltd., and the dry etching rate was calculated by dividing the film thickness difference by the etching time. The results are shown in Table 4.

TABLE 4

| | Film composition | Etching rate (Å/s) |
|---|---|---|
| Example 2-1 | UL-1 | 37 |
| Example 2-2 | UL-2 | 37 |
| Example 2-3 | UL-3 | 36 |
| Example 2-4 | UL-4 | 36 |
| Example 2-5 | UL-5 | 38 |
| Example 2-6 | UL-6 | 36 |
| Example 2-7 | UL-7 | 35 |
| Comparative example 2-1 | Comparative UL-1 | 32 |
| Comparative example 2-2 | Comparative UL-2 | 19 |
| Comparative example 2-3 | Comparative UL-3 | 23 |
| Comparative example 2-4 | Comparative UL-4 | 29 |
| Comparative example 2-5 | PR-1 | 24 |

As shown in Table 4, it could be understood that all of the inventive resist under layer film compositions (UL-1 to 7) exhibited higher etching rate than that of the resist upper layer film (comparative example 2-5) and had an excellent dry etching property. This result indicates that using the inventive resist under layer film compositions (UL-1 to 7) can inhibit the generation of residue after removal of the resist under layer film in the processing steps including the removal of the resist under layer film by dry etching after processing the substrate. Comparative examples 2-2 and 2-3, on the other hand, exhibited lower dry etching rate, which indicates that using the comparative resist under layer film compositions (comparative UL-2 and 3) easily cause residues when the resist under layer film is removed by dry etching.

Evaluation of Filling Property (Examples 3-1 to 3-7, Comparative Examples 3-1 to 3-4)

Figure 2:
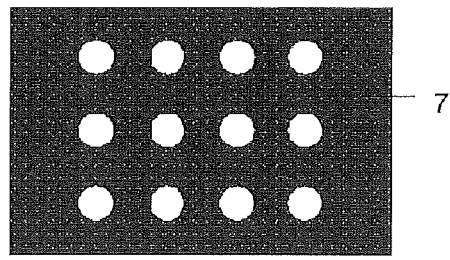
FIG. 2 is an explanatory view of the filling property evaluation method in examples.
Figure 2:
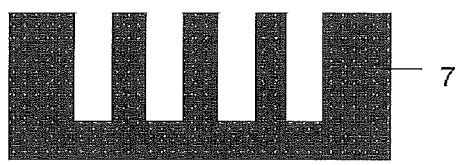
Figure 2:
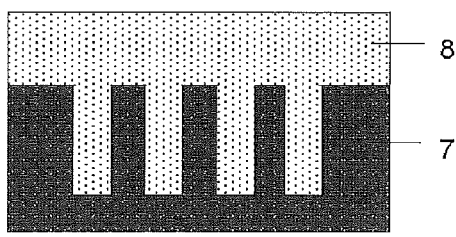

The resist under layer film compositions (UL-1 to 7, comparative UL-1 to 4) were each applied on a SiO2 wafer substrate having a dense hole pattern (hole diameter: 0.16 pm, hole depth: 0.50 μm, distance between the centers of the adjacent two holes: 0.32 μm), and baked for 60 seconds at a temperature shown in Table 5 to form a resist under layer film. The substrate used is a $SiO_2$ wafer substrate 7 having a dense hole pattern as shown in FIG. 2(G) (downward view) and FIG. 2(H) (sectional view). Cross-sectional shapes of the obtained wafer substrates were observed by using a scanning electron microscope (SEM), and whether inside of the hole was filled with the resist under layer film without voids or not was checked. The results are shown in Table 5. When a resist under layer film composition inferior in filling property is used, voids occur at the inside of the hole in this evaluation. When a resist under layer film composition having good filling property is used, in this evaluation, the inside of the hole of the $SiO_2$ wafer substrate 7 having the dense hole pattern is filled with the resist under layer film 8 without voids as shown in FIG. 2(I).

TABLE 5

| | Resist under layer film composition | Baking temperature | Presence or absence of voids |
|---|---|---|---|
| Example 3-1 | UL-1 | 220° C. | absence |
| Example 3-2 | UL-2 | 220° C. | absence |
| Example 3-3 | UL-3 | 250° C. | absence |
| Example 3-4 | UL-4 | 220° C. | absence |
| Example 3-5 | UL-5 | 250° C. | absence |
| Example 3-6 | UL-6 | 250° C. | absence |
| Example 3-7 | UL-7 | 220° C. | absence |
| Comparative example 3-1 | Comparative UL-1 | 220° C. | presence |
| Comparative example 3-2 | Comparative UL-2 | 250° C. | presence |
| Comparative example 3-3 | Comparative UL-3 | 250° C. | presence |
| Comparative example 3-4 | Comparative UL-4 | 220° C. | presence |

As shown in Table 5, it could be understood that all of the inventive resist under layer film compositions (UL-1 to 7) could fill the hole pattern without voids, and had excellent filling property, compared with the comparative resist under layer film compositions (comparative UL-1 to 4).

Evaluation of Planarizing Property (Examples 4-1 to 4-7, Comparative Examples 4-1 to 4-4)

Figure 3:
FIG. 3 is an explanatory view of the planarizing property evaluation method in examples.
Figure 3:
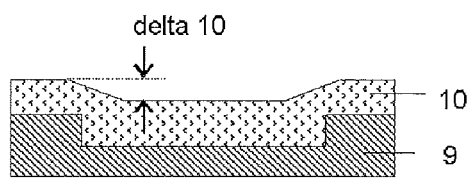

The resist under layer film compositions (UL-1 to 7, comparative UL-1 to 4) were each applied on a $SiO_2$ wafer substrate 9 having a giant isolated trench pattern (FIG. 3(J), trench width: 10 μm, trench depth: 0.1 μm), and baked under conditions shown in Table 6. Then, the difference between film thicknesses at the trench portion and the non-trench portion of the resist under layer film 10 (delta 10 in FIG. 3(K)) was observed by a scanning electron microscope (SEM). The results are shown in Table 6. In this evaluation, as the difference between the film thicknesses is small, planarizing property can be said to be good.

TABLE 6

| | Resist under layer film composition | Baking condition | Difference in film thicknesses (nm) |
|---|---|---|---|
| Example 4-1 | UL-1 | 220° C., 60 sec | 40 |
| Example 4-2 | UL-2 | 220° C., 60 sec | 45 |
| Example 4-3 | UL-3 | 250° C., 60 sec | 45 |
| Example 4-4 | UL-4 | 220° C., 60 sec | 40 |
| Example 4-5 | UL-5 | 250° C., 60 sec | 35 |
| Example 4-6 | UL-6 | 250° C., 60 sec | 40 |
| Example 4-7 | UL-7 | 220° C., 60 sec | 40 |
| Comparative example 4-1 | Comparative UL-1 | 220° C., 60 sec | 95 |
| Comparative example 4-2 | Comparative UL-2 | 250° C., 60 sec | 90 |
| Comparative example 4-3 | Comparative UL-3 | 250° C., 60 sec | 95 |
| Comparative example 4-4 | Comparative UL-4 | 220° C., 60 sec | 80 |

As shown in Table 6, it could be understood that the inventive resist under layer film compositions (UL-1 to 7) exhibited smaller difference between the thicknesses at the trench portion and the non-trench portion of the resist under layer film than the comparative resist under layer film compositions (comparative UL-1 to 4), and had excellent planarizing property.

Sublimate Measurement (Examples 5-1 to 5-7, Comparative Examples 5-1 to 5-4)

The resist under layer film compositions (UL-1 to 7, comparative UL-1 to 4) were each applied on a silicon substrate, and baked under condition shown in Table 7. Then, the number of particles with a size of 0.3 μm and 0.5 μm generated in a hot plate oven during baking were measured with a particle counter KR-11A, manufactured by RION Co., Ltd. The results are shown in Table 7.

TABLE 7

| | Resist under layer film composition | Baking condition | Number of 0.3-μm particles | Number of 0.5-μm particles |
|---|---|---|---|---|
| Example 5-1 | UL-1 | 220° C., 60 sec | 94 | 13 |
| Example 5-2 | UL-2 | 220° C., 60 sec | 2 | 0 |
| Example 5-3 | UL-3 | 250° C., 60 sec | 7 | 1 |
| Example 5-4 | UL-4 | 220° C., 60 sec | 4 | 0 |
| Example 5-5 | UL-5 | 250° C., 60 sec | 10 | 2 |
| Example 5-6 | UL-6 | 250° C., 60 sec | 49 | 9 |
| Example 5-7 | UL-7 | 220° C., 60 sec | 30 | 4 |
| Comparative example 5-1 | Comparative UL-1 | 220° C., 60 sec | 340 | 53 |
| Comparative example 5-2 | Comparative UL-2 | 250° C., 60 sec | 300 | 49 |
| Comparative example 5-3 | Comparative UL-3 | 250° C., 60 sec | 530 | 68 |
| Comparative example 5-4 | Comparative UL-4 | 220° C., 60 sec | 170 | 32 |

As shown in Table 7, it could be understood that the inventive resist under layer film compositions (UL-1 to 7) caused less particles during baking than that of the comparative resist under layer film compositions (comparative UL-1 to 4), and thus hardly contaminated the oven for baking. In addition, from the comparison between examples 5-1 and 5-2, it could be understood that example 5-2, which used the resist under layer film composition UL-2 having a dispersibility (Mw/Mn) of 1.8 or less by separation purification, showed less particles.

Evaluation of Alkali Aqueous Hydrogen Peroxide Resistance (Examples 6-1 to 6-7, Comparative Examples 6-1 to 6-4)

The resist under layer film compositions (UL-1 to 7, comparative UL-1 to 4) were each applied on a silicon wafer having a diameter of 4 inches (100 mm), and baked under conditions shown in Table 8 to form a resist under layer film having a thickness of about 200 nm. The wafer was then cut into pieces having a width of 2 cm. The wafer piece was immersed in a 1.0 mass % aqueous hydrogen peroxide containing 0.5 mass % ammonia at 23° C. for 10 minutes or at 65° C. for 5 minutes. Subsequently, the wafer piece was rinsed with deionized water to visually examine whether the resist under layer film was peeled from the wafer. If a part or whole of the resist under layer film was peeled and the surface of the silicon wafer was exposed, the resist under layer film subjected to the inspection was judged to have inadequate alkali aqueous hydrogen peroxide resistance. The results are shown in Table 8.

TABLE 8

| | Resist under layer film composition | Baking condition | Inspection result at 23° C. for 10 min | Inspection result at 65° C. for 5 min |
|---|---|---|---|---|
| Example 6-1 | UL-1 | 220° C., 60 sec | not peeled | not peeled |
| Example 6-2 | UL-2 | 220° C., 60 sec | not peeled | not peeled |
| Example 6-3 | UL-3 | 250° C., 60 sec | not peeled | not peeled |
| Example 6-4 | UL-4 | 220° C., 60 sec | not peeled | not peeled |
| Example 6-5 | UL-5 | 250° C., 60 sec | not peeled | not peeled |
| Example 6-6 | UL-6 | 250° C., 60 sec | not peeled | not peeled |
| Example 6-7 | UL-7 | 220° C., 60 sec | not peeled | not peeled |
| Comparative example 6-1 | Comparative UL-1 | 220° C., 60 sec | wholly peeled | wholly peeled |
| Comparative example 6-2 | Comparative UL-2 | 250° C., 60 sec | wholly peeled | wholly peeled |
| Comparative example 6-3 | Comparative UL-3 | 250° C., 60 sec | wholly peeled | wholly peeled |
| Comparative example 6-4 | Comparative UL-4 | 220° C., 60 sec | not peeled | partially peeled |

As shown in Table 8, it could be understood that the films of the inventive resist under layer film compositions (UL-1 to 7) were not peeled in either condition of immersion at 23° C. for 10 minutes or immersion at 65° C. for 5 minutes, and thus these compositions had good alkali aqueous hydrogen peroxide resistance. On the other hand, the resist under layer films of the comparative resist under layer film compositions (comparative UL-1 to 4) were partially or wholly peeled, and thus these compositions were inferior in alkali aqueous hydrogen peroxide resistance to the inventive resist under layer film compositions (UL-1 to 7).

Pattern Formation Evaluation (Examples 7-1 to 7-7, Comparative Examples 7-1 to 7-4)

The resist under layer film compositions (UL-1 to 7, comparative UL-1 to 4) were each applied on a silicon wafer substrate, and baked under conditions shown in Table 10 to form a resist under layer film. A resist middle layer film composition (SOG-1) was applied thereon and baked at 200° C. for 60 seconds to form a resist middle layer film having a thickness of 35 nm. The resist upper layer film composition (PR-1) was applied thereon and baked at 105° C. for 60 seconds to form a resist upper layer film having a thickness of 100 nm. A liquid immersion top coat composition (TC-1) was applied on the resist upper layer film, and baked at 90° C. for 60 seconds to form a top coat having a thickness of 50 nm.

As the resist middle layer film composition (SOG-1), a propylene glycol ethyl ether solution containing 2% the following polymer was prepared.

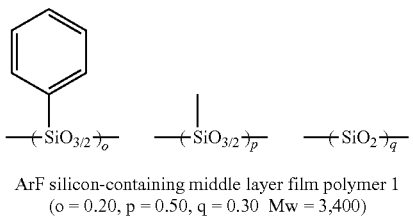

ArF silicon-containing middle layer film polymer 1
(o = 0.20, p = 0.50, q = 0.30  Mw = 3,400)

As to the liquid immersion top coat composition (TC-1), a top coat polymer was dissolved in an organic solvent with the proportion shown in Table 9, and the solution was filtered through a 0.1 μm filter made of a fluorine resin to prepare the composition.

TABLE 9

| No. | Polymer (parts by mass) | Organic solvent (parts by mass) |
|---|---|---|
| TC-1 | Top coat polymer (100) | Diisoamyl ether (2700) 2-methyl-1-butanol (270) |

The top coat polymer is shown below.
Top coat polymer: Molecular weight (Mw)=8,800
  Dispersibility (Mw/Mn)=1.69

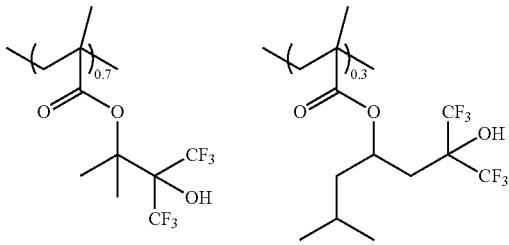

Top coat polymer

Then, the substrate was exposed by using an ArF liquid immersion exposure apparatus (NSR-S610C manufactured by Nikon Corporation, NA: 1.30, σ: 0.98/0.65, 35° s-polarized dipole illumination, 6% halftone phase shift mask), baked at 100° C. for 60 seconds (PEB), and developed by a 2.38 mass % tetramethylammonium hydroxide (TMAH) aqueous solution for 30 seconds to obtain 160 nm 1:1 positive line and space (L/S) resist upper layer film pattern.

Then, the resist middle layer film was processed by dry etching using the resist upper layer film pattern as a mask (pattern transfer) with an etching apparatus Telius manufactured by Tokyo Electron Ltd., and the resist under layer film was processed by dry etching using the obtained resist middle layer film pattern as a mask (pattern transfer) to form a resist under layer film pattern. The etching conditions are as follows.

(Condition for Transferring the Resist Upper Layer Film Pattern to the Resist Middle Layer Film)

| Chamber pressure | 10.0 Pa |
|---|---|
| RF power | 1,500 W |
| $CF_4$ gas flow rate | 75 mL/min |
| $O_2$ gas flow rate | 15 mL/min |
| Time | 15 sec |

(Condition for Transferring the Resist Middle Layer Film Pattern to the Resist Under Layer Film)

| Chamber pressure | 2.0 Pa |
|---|---|
| RF power | 500 W |
| Ar gas flow rate | 75 mL/min |
| $O_2$ gas flow rate | 45 mL/min |
| Time | 90 sec |

Whether the resist under layer film pattern can be formed or not was examined by a top-down SEM view of the wafer after pattern transfer (dry etching) to the resist under layer film. Then, the wafer was cut into pieces having a width of 2 cm. The wafer piece was immersed in a 1.0 mass % aqueous hydrogen peroxide containing 0.5 mass % ammonia at 23° C. for 10 minutes, washed with deionize water, and dried. Then, the resulting piece was observed by an optical microscope to evaluate whether the resist under layer film pattern was peeled or not. The results are shown in Table 10.

TABLE 10

| | Resist under layer film composition | Baking condition | Resist under layer film pattern | Peeling |
|---|---|---|---|---|
| Example 7-1 | UL-1 | 220° C., 60 sec | formable | not peeled |
| Example 7-2 | UL-2 | 220° C., 60 sec | formable | not peeled |
| Example 7-3 | UL-3 | 250° C., 60 sec | formable | not peeled |
| Example 7-4 | UL-4 | 220° C., 60 sec | formable | not peeled |
| Example 7-5 | UL-5 | 250° C., 60 sec | formable | not peeled |
| Example 7-6 | UL-6 | 250° C., 60 sec | formable | not peeled |
| Example 7-7 | UL-7 | 220° C., 60 sec | formable | not peeled |
| Comparative example 7-1 | Comparative UL-1 | 220° C., 60 sec | formable | wholly peeled |
| Comparative example 7-2 | Comparative UL-2 | 250° C., 60 sec | formable | wholly peeled |
| Comparative example 7-3 | Comparative UL-3 | 250° C., 60 sec | unformable | — |
| Comparative example 7-4 | Comparative UL-4 | 220° C., 60 sec | unformable | — |

As shown in Table 10, in all of the inventive patterning processes (examples 7-1 to 7-7), the resist upper layer film pattern could be favorably transferred to the resist under layer film, which indicates that the inventive resist under layer film composition (UL-1 to 7) can be suitably used for a fine lithography by the multilayer resist method. In addition, it was revealed that the formed resist under layer film pattern had alkali aqueous hydrogen peroxide resistance. From these results, it was demonstrated that the inventive patterning process enables the manufacture of a semiconductor apparatus by fine processing combing multilayer method and wet etching with an alkali aqueous hydrogen peroxide. By contrast, in comparative examples 7-1 and 7-2, although the resist under layer film pattern could be formed, the formed resist under layer film pattern had inadequate alkali aqueous hydrogen peroxide resistance and thus the film was peeled. In comparative examples 7-3 and 7-4, the resist under layer film pattern could not be formed.

As described above, it was revealed that the inventive patterning process, resist under layer film composition, and polymer for a resist under layer film composition are suitably used in the multilayer resist process for fine patterning in the manufacture of a semiconductor apparatus, in particular, applicable to the process including wet etching processing and the process using a substrate to be processed having unevenness, and thus extremely useful in industry.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A polymer for a resist under layer film composition, comprising a repeating unit shown by the formula (1) and a repeating unit shown by the formula (3),

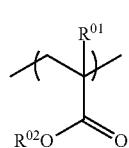
(1)

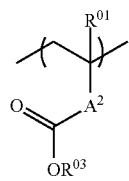
(3)

wherein $R^{01}$ independently represents a hydrogen atom or a methyl group; $R^{02}$ represents a group selected from the formulae (1-1) to (1-3); $R^{03}$ represents a saturated or unsaturated tertiary alkyl group having 4 to 20 carbon atoms and optionally containing a group selected from a cyclic ether group, an ether group, a hydroxy group, or an aromatic heterocyclic oxygen containing ring; and $A^2$ represents a single bond or a divalent linking group having 2 to 10 carbon atoms and containing an ester group,

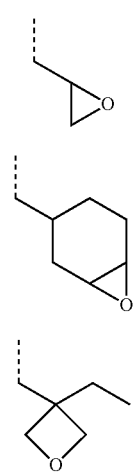
(1-1)
(1-2)
(1-3)

wherein the dotted line represents a bonding arm, wherein the repeating unit shown by the formula (3) is a repeating unit shown by the formula (3-1)

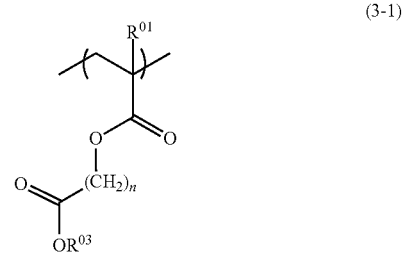
(3-1)

wherein $R^{01}$ and $R^{03}$ have the same meanings as above; n represents an integer of 1 to 5, and the polymer for a resist under layer film composition further comprises a repeating unit shown by the formula (2),

(2)

wherein $R^{01}$ has the same meaning as above; $A^1$ represents a single bond, an ester group, or a divalent linking group having 2 to 10 carbon atoms and containing an ester group; $Ar^1$ represents a substituted or unsubstituted aryl group having 6 to 20 carbon atoms.

2. The polymer for a resist under layer film composition according to claim 1, wherein a content of the repeating unit shown by the formula (1) is within a range of 20 mol % to 90 mol % with respect to the whole repeating units contained in the polymer, and a content of the repeating unit shown by the formula (3) is within a range of 5 mol % to 50 mol % with respect to the whole repeating units contained in the polymer.

3. The polymer for a resist under layer film composition according to claim 1, wherein a content of the repeating unit shown by the formula (2) is within a range of 5 mol % to 50 mol % with respect to the whole repeating units contained in the polymer.

4. The polymer for a resist under layer film composition according to claim 1, wherein a weight average molecular weight of the polymer is within a range of 1,000 to 20,000.

5. The polymer for a resist under layer film composition according to claim 1, wherein a glass transition temperature of the polymer is 50° C. or lower.

6. The polymer for a resist under layer film composition according to claim 1, wherein a dispersibility of the polymer is 2.0 or less, the dispersibility being shown by a weight average molecular weight/a number average molecular weight of the polymer.

7. A resist under layer film composition for use in a multilayer resist method, comprising
(A) a base resin of the polymer for a resist under layer film composition according to claim 1, and
(B) an organic solvent.

8. The resist under layer film composition according to claim 7, further comprising one or more of (C) an acid generator, (D) a surfactant, (E) a crosslinking agent, (F) a plasticizer, and (G) a colorant.

9. The resist under layer film composition according to claim 7, wherein the resist under layer film composition is capable of forming a resist under layer film that is not peeled when the resist under layer film is formed on a silicon substrate and the silicon substrate is immersed in a 1.0 mass % aqueous hydrogen peroxide containing 0.5 mass % ammonia at 23° C. for 10 minutes.

10. The resist under layer film composition according to claim 7, wherein the resist under layer film composition is capable of forming a resist under layer film that is not peeled when the resist under layer film is formed on a silicon substrate and the silicon substrate is immersed in a 1.0 mass % aqueous hydrogen peroxide containing 0.5 mass % ammonia at 65° C. for 5 minutes.

11. A patterning process for forming a pattern in a substrate to be processed, the process comprising the steps of:
   (I-1) forming a resist under layer film on the substrate to be processed by using the resist under layer film composition according to claim 7;
   (I-2) forming a resist upper layer film on the resist under layer film by using a photoresist composition;
   (I-3) subjecting the resist upper layer film to pattern exposure and development with a developer to form a pattern in the resist upper layer film; and
   (I-4) transferring the pattern to the resist under layer film by dry etching using the resist upper layer film having the formed pattern as a mask.

12. The patterning process according to claim 11, further comprising, after the step (I-4), transferring the pattern to the substrate to be processed by wet etchingwith an alkali aqueous hydrogen peroxide using the resist under layer film having the transferred pattern as a mask.

13. The patterning process according to claim 11, further comprising, after the step (I-4), implanting an ion by using the resist under layer film having the transferred pattern as a mask to form the pattern in the substrate to be processed.

14. The patterning process according to claim 13, further comprising, after implanting the ion to form the pattern in the substrate to be processed, removing the resist middle layer film having the transferred pattern by wet etching with an alkali aqueous hydrogen peroxide.

15. The patterning process according to claim 11, wherein a dry etching rate of the resist under layer film is higher than that of the resist upper layer film.

16. The patterning process according to claim 11, wherein the resist under layer film is formed by applying the resist under layer film composition on the substrate to be processed and performing a heat treatment at 100° C. to 300° C. for 10 to 600 seconds.

17. The patterning process according to claim 11, wherein the substrate to be processed is a substrate having a structure or a step with a height of 30 nm or more.

18. A patterning process for forming a pattern in a substrate to be processed, the process comprising the steps of:
   (II-1) forming a resist under layer film on the substrate to be processed by using the resist under layer film composition according to claim 7;
   (II-2) forming a resist middle layer film on the resist under layer film;
   (II-3) forming a resist upper layer film on the resist middle layer film by using a photoresist composition;
   (II-4) subjecting the resist upper layer film to pattern exposure and development with a developer to form a pattern in the resist upper layer film;
   (II-5) transferring the pattern to the resist middle layer film by dry etching using the resist upper layer film having the formed pattern as a mask; and
   (II-6) transferring the pattern to the resist under layer film by dry etching using the resist middle layer film having the transferred pattern as a mask.

19. The patterning process according to claim 18, further comprising, after the step (II-6), removing the resist middle layer film having the transferred pattern by wet etching with an alkali aqueous hydrogen peroxide.

20. The patterning process according to claim 18, further comprising, after the step (II-6), transferring the pattern to the substrate to be processed by wet etching with an alkali aqueous hydrogen peroxide using the resist under layer film having the transferred pattern as a mask.

21. The patterning process according to claim 18, further comprising, after the step (II-6), implanting an ion by using the resist under layer film having the transferred pattern as a mask to form the pattern in the substrate to be processed.

22. The patterning process according to claim 21, further comprising, after implanting the ion to form the pattern in the substrate to be processed, removing the resist middle layer film having the transferred pattern by wet etching with an alkali aqueous hydrogen peroxide.

23. The patterning process according to claim 18, wherein a dry etching rate of the resist under layer film is higher than that of the resist upper layer film.

24. The patterning process according to claim 18, wherein the resist under layer film is formed by applying the resist under layer film composition on the substrate to be processed and performing a heat treatment at 100° C. to 300° C. for 10 to 600 seconds.

25. The patterning process according to claim 18, wherein the substrate to be processed is a substrate having a structure or a step with a height of 30 nm or more.

26. A patterning process for forming a pattern in a substrate to be processed, the process comprising the steps of:
   (III-1) forming a resist under layer film on the substrate to be processed by using the resist under layer film composition according to claim 7;
   (III-2) forming an inorganic hard mask intermediate film selected from a silicon oxide film, a silicon nitride film, and silicon oxynitride film on the resist under layer film;
   (III-3) forming an organic anti-reflective film on the inorganic hard mask intermediate film;
   (III-4) forming a resist upper layer film on the organic anti-reflective film by using a photoresist composition;
   (III-5) subjecting the resist upper layer film to pattern exposure and development with a developer to form a pattern in the resist upper layer film;
   (III-6) transferring the pattern to the organic anti-reflective film and the inorganic hard mask intermediate film by dry etching using the resist upper layer film having the formed pattern as a mask; and
   (III-7) transferring the pattern to the resist under layer film by dry etching using the inorganic hard mask intermediate film having the transferred pattern as a mask.

27. The patterning process according to claim 26, further comprising, after the step (III-7), transferring the pattern to the substrate to be processed by wet etching with an alkali aqueous hydrogen peroxide using the resist under layer film having the transferred pattern as a mask.

28. The patterning process according to claim 26, further comprising, after the step (III-7), implanting an ion by using the resist under layer film having the transferred pattern as a mask to form the pattern in the substrate to be processed.

29. The patterning process according to claim 28, further comprising, after implanting the ion to form the pattern in the substrate to be processed, removing the resist middle layer film having the transferred pattern by wet etching with an alkali aqueous hydrogen peroxide.

30. The patterning process according to claim 26, wherein a dry etching rate of the resist under layer film is higher than that of the resist upper layer film.

31. The patterning process according to claim 26, wherein the resist under layer film is formed by applying the resist under layer film composition on the substrate to be processed and performing a heat treatment at 100° C. to 300° C. for 10 to 600 seconds.

32. The patterning process according to claim 26, wherein the substrate to be processed is a substrate having a structure or a step with a height of 30 nm or more.

\* \* \* \* \*